United States Patent
Shimizu et al.

(10) Patent No.: US 10,490,748 B2
(45) Date of Patent: Nov. 26, 2019

(54) RECTIFYING ELEMENT, METHOD FOR PRODUCING SAME, AND WIRELESS COMMUNICATION DEVICE

(71) Applicant: TORAY INDUSTRIES, INC., Tokyo (JP)

(72) Inventors: Hiroji Shimizu, Otsu (JP); Seiichiro Murase, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 6 days.

(21) Appl. No.: 15/711,560

(22) Filed: Sep. 21, 2017

(65) Prior Publication Data

US 2018/0026197 A1      Jan. 25, 2018

Related U.S. Application Data

(63) Continuation of application No. PCT/JP2016/059935, filed on Mar. 28, 2016.

(30) Foreign Application Priority Data

Apr. 1, 2015   (JP) ................................. 2015-074977

(51) Int. Cl.
  *H01L 51/00*   (2006.01)
  *C08G 61/12*   (2006.01)
  (Continued)

(52) U.S. Cl.
  CPC ........ *H01L 51/0048* (2013.01); *C08G 61/126* (2013.01); *G06K 19/0723* (2013.01);
  (Continued)

(58) Field of Classification Search
  CPC ............................................................. H01L 51/0048; H01L 29/868; H01L 29/861; H01Q 1/368
  See application file for complete search history.

(56) References Cited

U.S. PATENT DOCUMENTS

| | | | |
|---|---|---|---|
| 2007/0007342 A1* | 1/2007 | Cleeves ........... | G06K 19/07749 235/435 |
| 2011/0068417 A1* | 3/2011 | Murase ................ | C08G 59/306 257/410 |

(Continued)

FOREIGN PATENT DOCUMENTS

| | | |
|---|---|---|
| JP | 2005067059 A | 3/2005 |
| JP | 2005259737 A | 9/2005 |

(Continued)

OTHER PUBLICATIONS

International Search Report and Written Opinion for International Application No. PCT/JP2016/059935, dated Apr. 26, 2016—7 Pages.

*Primary Examiner* — Julia Slutsker
(74) *Attorney, Agent, or Firm* — Ratnerprestia

(57) ABSTRACT

There is provided a rectifying element which is provided with an insulating base, (a) a pair of electrodes composed of a first electrode and a second electrode and (b) a semiconductor layer arranged between the pair of electrodes, wherein the components (a) and (b) are provided on a first surface of the insulating base. The rectifying element is configured such that the semiconductor layer (b) contains carbon nanotube composites each of which comprises a carbon nanotube and a conjugated polymer adhered onto at least a part of the surface of the carbon nanotube. The present invention provides a rectifying element having excellent rectifying properties by a simple process.

15 Claims, 3 Drawing Sheets

(51) Int. Cl.
*G06K 19/07* (2006.01)
*H01Q 1/24* (2006.01)
*H01Q 1/36* (2006.01)
H01L 51/05 (2006.01)
H01Q 1/22 (2006.01)

(52) U.S. Cl.
CPC ............ *H01Q 1/248* (2013.01); *H01Q 1/368* (2013.01); *C08G 2261/1412* (2013.01); *C08G 2261/3223* (2013.01); *C08G 2261/3246* (2013.01); *H01L 51/0036* (2013.01); *H01L 51/0575* (2013.01); *H01Q 1/2225* (2013.01)

(56) References Cited

U.S. PATENT DOCUMENTS

| | | | |
|---|---|---|---|
| 2011/0121273 A1* | 5/2011 | Jo | B82Y 10/00 257/40 |
| 2011/0216566 A1* | 9/2011 | Kamata | H01L 29/7869 363/127 |
| 2014/0225058 A1 | 8/2014 | Okada et al. | |
| 2016/0035457 A1 | 2/2016 | Murase et al. | |

FOREIGN PATENT DOCUMENTS

| | | |
|---|---|---|
| JP | 2007059880 A | 3/2007 |
| JP | 2011126727 A | 6/2011 |
| JP | 2011205882 A | 10/2011 |
| JP | 2011234414 A | 11/2011 |
| WO | 2005067059 A1 | 7/2005 |
| WO | 2009139339 A1 | 11/2009 |
| WO | 2014142105 A1 | 2/2017 |

* cited by examiner

RECTIFYING ELEMENT, METHOD FOR PRODUCING SAME, AND WIRELESS COMMUNICATION DEVICE

CROSS REFERENCE TO RELATED APPLICATIONS

This is a Continuation application of PCT/JP2016/059935, filed Mar. 28, 2016, which claims priority to Japanese Patent Application No. 2015-074977, filed Apr. 1, 2015, the disclosures of these applications being incorporated herein by reference in their entireties for all purposes.

TECHNICAL FIELD OF THE INVENTION

The present invention relates to a rectifying element, a method for producing the rectifying element, and a wireless communication device.

BACKGROUND OF THE INVENTION

In recent years, a wireless communication system utilizing a RFID (Radio Frequency IDentification) technique has been developed as a contactless-type tag. A RFID tag is required to be produced at low cost. Therefore, it is the common practice to provide no power source on the tag. An antenna installed in the tag receives a carrier wave sent from an antenna in an external reader/writer and induces an electromotive force through electromagnetic induction, and a rectifier circuit in the tag generates a direct current from an alternating current induced in the rectifier circuit. In this manner, a wireless power source can be produced.

It is critical for the rectifier circuit to be installed in the RFID tag to produce a maximum direct-current output voltage by a minimum alternating-current input voltage signal amplitude. For this purpose, the rectifying element constituting the rectifier circuit is required to have high power conversion efficiency, i.e., low electric power loss.

The underlying cause of the electric power loss in a rectifying element is the loss of an electric power which is caused by the electric resistance of the rectifying element. Therefore, in order to reduce the electric power loss, it is critical to reduce the forward resistance of the rectifying element. Therefore, it has been widely studied to use a member capable of achieving this reduction as a semiconductor layer in a rectifying element.

On the other hand, a carbon nano material having a sharp-pointed tip shape and a high aspect ratio, typically a carbon nanotube (also referred to as "CNT", hereinafter), has high electrical conductivity. Many types of carbon nano materials have been developed as semiconductor materials and materials for fuel cells, and have also been used in rectifying elements. A CNT is expected to be used as a rectifying element that can be operated at a high frequency, because a CNT has good electrical properties, rapid responsibility and the like. A CNT is also expected to be reduced in size and to be installed at high density.

However, for reducing the forward resistance of a rectifying element utilizing CNTs and improving the stability of the element, it is critical to disperse multiple CNTs uniformly in a semiconductor layer in the rectifying element. Then, a technique has been proposed, which can produce a stable rectifying element using a CNT structure having a structure such that multiple CNTs form a network structure through crosslinked sites (see, for example, Patent Document 1).

PATENT DOCUMENT

Patent Document 1: International Publication No. 2005/067059

SUMMARY OF THE INVENTION

When multiple CNTs are dispersed uniformly in a semiconductor layer in a rectifying element, it becomes possible to increase a current flowing into the rectifying element, reduce the resistance of the rectifying element and improve the stability of the rectifying element. However, when multiple CNTs are simply used, the resistance of the rectifying element is increased and the performance of the rectifying element becomes unstable due to the contact between the CNTs and the variations in the positions of the CNTs.

In the technique disclosed in Patent Document 1, it is studied to introduce a functional group into CNTs and form crosslinked sites in the CNTs with a crosslinking agent or through a chemical bond between the functional groups. In this technique, however, the dispersion of the CNTs is insufficient, the current flowing into the rectifying element is small, and it is needed to introduce a functional group into the CNTs and to form crosslinked sites in the CNTs. Therefore, this technique has a problem that the number of steps for the production of a rectifying element is increased.

The present invention has focused attention on this problem, and embodiments of the invention address the problem of providing a rectifying element which can exhibit excellent rectifying properties by a simple process.

In order to solve the above-mentioned problems, one aspect of the present invention comprises a rectifying element comprising an insulating base, (a) a pair of electrodes composed of a first electrode and a second electrode and (b) a semiconductor layer arranged between the pair of electrodes, the components (a) and (b) being provided on a first surface of the insulating base, wherein the semiconductor layer (b) contains carbon nanotube composites each of which comprises a carbon nanotube and a conjugated polymer adhered onto at least a part of the surface of the carbon nanotube.

One aspect of the present invention includes a rectifying element which comprises an insulating base, (a) a pair of electrodes composed of a first electrode and a second electrode, (b) a semiconductor layer arranged between the pair of electrodes (a), (c) an insulating layer and (d) a third electrode, the components (a) to (d) being provided on a first surface of the insulating base, wherein any one of the pair of electrodes (a) is electrically connected to the third electrode (d) and the third electrode (d) is electrically insulated from the semiconductor layer (b) by the insulating layer (c).

Another aspect of the present invention is a rectifying element comprising an insulating base, (a) a pair of electrodes composed of a first electrode and a second electrode and (b) a semiconductor layer arranged between the pair of electrodes, the components (a) and (b) are provided on a first surface of the insulating base, wherein the semiconductor layer (b) contains carbon nanotubes and the total length of the carbon nanotubes which are present per 1 $\mu m^2$ of the semiconductor layer (b) is 10 to 50 $\mu m$.

Another aspect of the present invention includes a method for producing the above-mentioned rectifying element, comprising the step of applying a composition containing carbon nanotube composites onto a base to form a semiconductor layer, wherein each of the carbon nanotube composites comprises a carbon nanotube and a conjugated polymer adhered onto at least a part of the surface of the carbon nanotube.

Another aspect of the present invention includes a rectifier circuit comprising at least the above-mentioned rectifying element and a capacitor.

One aspect of the present invention also includes a wireless communication device comprising at least the above-mentioned rectifier circuit and an antenna.

Another aspect of the present invention also includes a commodity tag utilizing the above-mentioned wireless communication device.

According to embodiments of the present invention, a rectifying element having excellent rectifying properties can be produced by a simple process.

DETAILED DESCRIPTION OF EMBODIMENTS OF THE INVENTION

<Rectifying Element>

The rectifying element according to an embodiment of the present invention comprises an insulating base, (a) a pair of electrodes composed of a first electrode and a second electrode and (b) a semiconductor layer arranged between the pair of electrodes, the components (a) and (b) being provided on a first surface of the insulating base, wherein the semiconductor layer (b) contains carbon nanotube composites (also referred to as "CNT composites", hereinafter) each of which comprises a carbon nanotube (also referred to as a "CNT", hereinafter) and a conjugated polymer adhered onto at least a part of the surface of the carbon nanotube. The first surface of the insulating base refers to any one of the surfaces of the insulating base.

Figure 1:
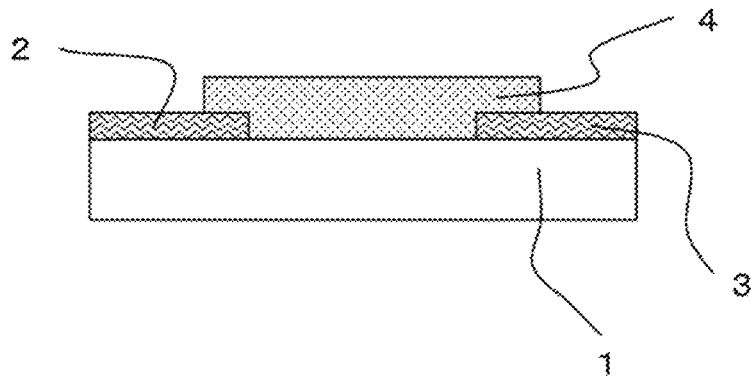
FIG. 1 shows a schematic cross-sectional view illustrating a rectifying element which is one aspect of the present invention.

FIG. 1 shows a schematic cross-sectional view illustrating a first embodiment of the rectifying element of the present invention. In FIG. 1, a pair of electrodes, i.e., a first electrode 2 and a second electrode 3, are provided on a first surface of an insulating base 1, and a semiconductor layer 4 containing CNT composites is formed between the electrodes.

As the rectifying element of the present invention, an aspect is also preferred, which comprises an insulating base, (a) a pair of electrodes composed of a first electrode and a second electrode, (b) a semiconductor layer arranged between the pair of electrodes (a), (c) an insulating layer and (d) a third electrode, the components (a) to (d) being provided on a first surface of the insulating base, wherein any one of the pair of electrodes (a) is electrically connected to the third electrode (d), the third electrode (d) is electrically insulated from the semiconductor layer (b) by the insulating layer (c), and the semiconductor layer (b) contains carbon nanotube composites each of which comprises a carbon nanotube and a conjugated polymer adhered onto at least a part of the surfaces of the carbon nanotube.

Figure 2:
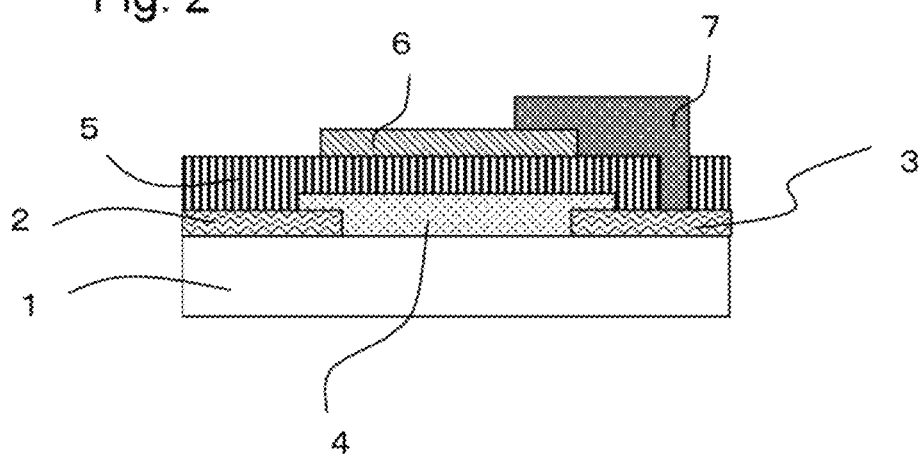
FIG. 2 shows a schematic cross-sectional view illustrating a rectifying element which is one aspect of the present invention.

In this aspect, an embodiment as mentioned below is also included. In FIG. 2, a schematic cross-sectional view of an example of a second embodiment of the rectifying element of the present invention is shown. A pair of electrodes, i.e., a first electrode 2 and a second electrode 3, are provided on a first surface of an insulating base 1, and a semiconductor layer 4 containing CNT composites is formed between the electrodes. An insulating layer 5 is provided on the semiconductor layer 4, and a third electrode 6 is formed on the insulating layer 5. The second electrode 3 and the third electrode 6 are electrically connected to each other through a wiring line 7. The third electrode 6 is electrically insulated from the semiconductor layer 4 by the insulating layer 5.

Figure 3:
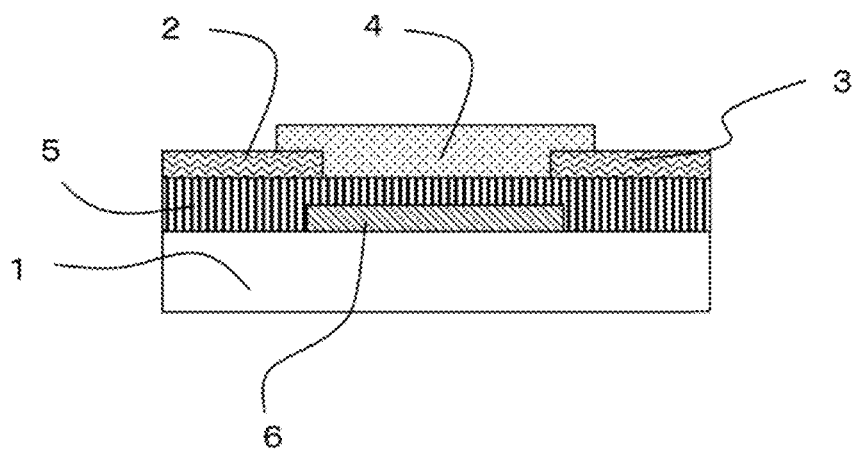
FIG. 3 shows a schematic cross-sectional view illustrating a rectifying element which is one aspect of the present invention.

In FIG. 3, a schematic cross-sectional view of an example of a third embodiment of the rectifying element of the present invention is shown. A third electrode 6 is provided on a first surface of an insulating base 1 and is covered with an insulating layer 5. A pair of electrodes, i.e., a first electrode 2 and a second electrode 3, are provided on the insulating layer 5, and a semiconductor layer 4 containing CNT composites is formed between the electrodes. The second electrode 3 and the third electrode 6 are electrically connected to each other through a wiring line that is not shown in the drawing. The third electrode 6 is electrically insulated from the semiconductor layer 4 by the insulating layer 5.

The following explanation is common to all of embodiments, unless otherwise stated.

(Insulating Base)

The material to be used for the insulating base may be any one, as long as a surface thereof on which electrodes are to be provided can have insulation properties. For example, a smooth base, such as an inorganic material composed of a glass, sapphire, an alumina sintered material, a silicon wafer or the like of which the surface is coated with an oxide film and an organic material such as poly(ethylene terephthalate), polyimide, polyester, polycarbonate, polysulfone, polyether sulfone, polyethylene, polyphenylene sulfide and polyparaxylene, can be used suitably.

(Electrodes)

The materials to be used for the pair of electrodes and the third electrode may be any one, as long as the materials are conductive materials that can be used for electrodes. Specific examples of the materials include, but limited to: a conductive metal oxide such as tin oxide, indium oxide and indium tin oxide (ITO); a metal such as platinum, gold, silver, copper, iron, tin, zinc, aluminum, indium, chromium, lithium, sodium, potassium, cesium, calcium, magnesium, palladium, molybdenum, amorphous silicon and polysilicon, or an alloy of the metal; an inorganic conductive compound such as copper iodide and copper sulfide; and a conductive polymer such as a complex of poly(styrenesulfonic acid) and polythiophene, polypyrrole, polyaniline or polyethylenedioxythiophene. It is preferred for the conductive polymer to be improved in conductivity by means of doping with iodine or the like. These electrode materials may be used singly, or two or more of them may be laminated on or mixed with each other upon use.

Among these electrode materials, an electrode material containing a conductive material and a binder is preferred, from the viewpoint of improving the flexibility of the electrodes and achieving good adhesion upon bending and good electrical connection.

The binder is not particularly limited, and preferably contains a component selected from a monomer, an oligomer, a polymer, a photopolymerization initiator, a plasticizer, a leveling agent, a surfactant, a silane coupling agent, an antifoaming agent, a pigment and the like. From the viewpoint of the improvement in bending resistance of the electrodes, it is preferred for the binder to contain at least an oligomer or a polymer.

The oligomer or the polymer is not particularly limited, and an acrylic resin, an epoxy resin, a novolac resin, a phenolic resin, a polyimide precursor, a polyimide or the like can be used preferably. From the viewpoint of the cracking resistance at bending, an acrylic resin is preferred. This is probably because the grass transition temperature of an acrylic resin is 100° C. or lower and, therefore, the acrylic resin is softened upon the thermal curing of the electrodes, resulting in the improvement in the binding between particles of the conductive material.

An acrylic resin is a resin which contains at least a structure derived from an acrylic monomer in the repeating units thereof. Specific examples of the preferred acrylic monomer include, but are not particularly limited to, acrylic monomers such as methyl acrylate, acrylic acid, 2-ethylhexyl acrylate, ethyl methacrylate, n-butyl acrylate, i-butyl acrylate, i-propane acrylate, glycidyl acrylate, N-methoxymethylacrylamide, N-ethoxymethylacrylamide, N-n-butoxymethylacrylamide, N-isobutoxymethylacrylamide, butoxytriethylene glycol acrylate, dicyclopentanyl acrylate, dicyclopentenyl acrylate, 2-hydroxyethyl acrylate, isobonyl acrylate, 2-hydroxypropyl acrylate, isodecyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, acrylamide, aminoethyl acrylate, phenyl acrylate, phenoxyethyl acrylate, 1-naphthyl acrylate, 2-naphthyl acrylate, thiophenol acrylate and benzylmercaptan acrylate, and those with acrylate of the above-mentioned monomers replaced by methacrylate. These acrylic monomers may be used singly, or two or more of them may be used in combination. Alternatively, the acrylic monomer may be copolymerized with another monomer, such as a styrene compound (e.g., styrene, p-methylstyrene, o-methylstyrene, m-methylstyrene, α-methylstyrene, chloromethylstyrene, hydroxymethylstyrene), γ-methacryloyloxypropyltrimethoxysilane, 1-vinyl-2-pyrrolidone and the like.

The conductive material may be any one, as long as the conductive material can be used as an electrode, and preferably comprises metal particles.

A preferred specific example of the metal particles are metal particles containing at least one metal selected from gold, silver, copper, platinum, lead, tin, nickel, aluminum, tungsten, molybdenum, ruthenium oxide, chromium, titanium, carbon and indium. These metal particles may be used singly, or two or more types of them may be used in the form of a mixture, or metal particles containing an alloy made from multiple metals selected from the above-mentioned metals may be used.

Among these metal particles, particles of gold, silver, copper or platinum are preferred, from the viewpoint of electrical conductivity. Particles of silver are more preferred, from the viewpoint of cost and stability. It is still further preferred for the metal particles to contain carbon black, from the viewpoint of reducing the electric resistivity of the electrodes.

The measure of the unevenness of the surface of an electrode is arithmetic average roughness (Ra) of the surface of the electrode. The Ra value is preferably 5 to 200 nm. When the Ra value is 5 nm or more, an anchoring effect can be exerted effectively. When the Ra value is 200 nm or less, it becomes possible to form a ferroelectric material film having no pinhole defect. The occurrence of no pinhole defect leads to the prevention of the occurrence of short circuit in a ferroelectric material memory element.

The surface roughness can be measured with a surface shape measurement device or an atomic force microscope (AFM). In the case where a surface shape measurement device is used, the measurement of an Ra value is carried out at arbitrary 5 points on an electrode and an average of the Ra values is employed. Likewise, in the case where an AFM is used, the measurement of an Ra value is also carried out at arbitrary 5 points on an electrode and an average of the Ra values is employed. These measurement methods can be selected depending on the sizes of electrodes. In the case where the Ra value can be measured by both of the methods, a value measured with a surface shape measurement device is employed.

The average particle diameter of the metal particles in an electrode is preferably 0.01 to 5 μm, more preferably 0.01 to 2 μm. When the average particle diameter is 0.01 μm or more, a concavo-convex shape can be formed easily on the surface of the electrode and, as a result, the adhesion between the electrode and the ferroelectric material film can be further improved. When the average particle diameter is 5 μm or less, it becomes possible to produce an electrode having high bending resistance. When the average particle diameter is 2 μm or less, it becomes possible to further reduce the occurrence of short circuit in the element during the production of the element, resulting in the increase in yield of the element.

In the present invention, the average particle diameter of the metal particles in an electrode can be determined in, for example, the following-manner. A fracture surface of the electrode is observed with an electron microscope to confirm the presence of particles. When particles are observed, it is confirmed whether or not the particles are metal particles with an energy dispersive X-ray (EDX) spectroscopy. Subsequently, the particle diameters of 100 particles that are randomly selected among from the metal particles are observed with an electron microscope to determine an average value of the particle diameters. In this manner, the average particle diameter is calculated.

When each of the metal particles has a spherical shape, the diameters of the metal particles correspond to the particle diameters thereof. When each of the metal particles has a non-spherical shape, one of the metal particles is observed with an electron microscope to determine a largest width and a smallest width of the particle and an average of the largest width and the smallest width is calculated as the particle diameter of the particle.

The content of the conductive material in an electrode is preferably 70 to 95% by mass relative to the mass of the electrode. The lower limit of the content is preferably 80% by mass or more. The upper limit of the content is preferably 90% by mass or less. When the content of the conductive material falls within the above-mentioned range, it becomes possible to reduce the specific resistance value of the electrode and the probability of disconnection in the electrode.

In the first embodiment, rectifying properties can be exerted by appropriately adjusting the level of a voltage to be applied to the first electrode 2 and the second electrode 3. For the improvement of the efficiency of the rectifying properties, it is preferred to make the potential barrier at the interface between one of the first electrode 2 and the second electrode 3 and the semiconductor layer 4 asymmetrical to the potential barrier at the interface between the other of the first electrode 2 and the second electrode 3 and the semiconductor layer 4. A specific example of the method for achieving this phenomenon is a method in which the first electrode and the second electrode are made from different materials from each other. Alternatively, it also becomes possible to oxidize the electrode surface of one of the first electrode 2 and the second electrode 3 to make the connection configuration at the interface between the first electrode 2 and the semiconductor layer 4 different from that at the interface between the second electrode 3 and the semiconductor layer 4.

The term "potential barrier" as used herein refers to the degree of the size of the energy barrier at the interface between an electrode and the semiconductor layer. The potential barrier can be expressed as the difference between the work function of a material used for the electrode and that of a material used for the semiconductor layer. The work function can be measured by a known method such as a Kelvin method and a photoelectron method. The work function to be employed in the present invention is a value obtained by the measurement under the atmosphere by a Kelvin method using a Kelvin probe device.

The term "the potential barriers are asymmetrical to each other" refers to a fact that, with respect to the work functions of the first electrode 2, the second electrode 3 and the semiconductor layer 4, there is such a relationship between a work function difference 1, which is expressed by the formula: ((a work function of the first electrode)−(a work function of the semiconductor layer)), and a work function difference 2, which is expressed by the formula: ((a work function of the second electrode)−(a work function of the semiconductor layer)), that the positivity/negativity of the work functions are reversed with each other. This relationship means that the work function 1, a work function of the semiconductor layer and the work function 2 increase or decrease in this order. When the potential barriers are asymmetrical to each other as mentioned above, rectifying properties can be exerted more efficiently upon the application of a voltage.

In the second embodiment, the materials to be used for the first electrode 2, the second electrode 3 and the third electrode 6 may be the same as or different from one another.

The widths and thicknesses of the electrodes and the distance between the electrode 2 and the electrode 3 may be adjusted arbitrarily. From the viewpoint of forming electrode patterns easily, the width of each of the electrodes, the thickness of each of the electrodes and the distance between the electrode 2 and the electrode 3 are preferably 10 μm to 10 mm, 0.01 to 100 μm and 1 to 100 μm, respectively, but are not limited thereto.

As the method for forming each of the electrodes, resistive thermal evaporation, electron beam, sputtering, plating, CVD, ion plating coating, inkjet, printing and the like can be mentioned. In the case where a paste containing a binder and a conductive material is used as the electrode material, a method can be mentioned, in which the paste is applied onto a substrate by a conventional method, such as a spin coating method, a blade coating method, a slit die coating method, a screen printing method, a bar coater method, a template method, a print transfer method and a dipping-withdrawing method and subsequently the paste is dried with an oven, a hot plate, infrared ray or the like. As the method for forming electrode patterns, an electrode thin film produced by the above-mentioned method may be patterned into a desired shape by a conventional photolithography method or may be patterned through a mask having a desired shape during the deposition or sputtering of the electrode substance.

In the second embodiment, the material to be used for electrically connecting the second electrode 3 to the third electrode 6 may be any one, as long as the material is a conventional conductive material, as in the case of the material for the electrodes. The connection method may be any one as long as the electrical conduction can be achieved as in the case of the electrode formation method, and the width and thickness of a connected part can be adjusted arbitrarily.

(Insulating Layer)

The material to be used for the insulating layer 5 is not particularly limited, and specific examples of the material include: an inorganic material such as silicon oxide and alumina; an organic high-molecular-weight material such as polyimide, poly(vinyl alcohol), poly(vinyl chloride), poly(ethylene terephthalate), poly(vinylidene fluoride), polysiloxane and polyvinylphenol (PVP); and a mixture of an inorganic material powder and an organic material. Among these materials, a material containing both an organic compound containing a bond between silicon and carbon and a metal compound containing a bond between a metal atom and an oxygen atom is preferred. Examples of the organic compound include a silane compound represented by general formula (2), an epoxy-group-containing silane compound represented by general formula (3), a condensation product of any one of the silane compounds, and a polysiloxane containing any one of aforementioned compounds as a polymerization component. Among these compounds, the polysiloxane is preferred, because the polysiloxane has high insulation properties and can be cured at a lower temperature.

$$R^7{}_m Si(OR^8)_{4-m} \qquad (2)$$

In the formula, $R^7$ represents a hydrogen atom, an alkyl group, a heterocyclic group, an aryl group or an alkenyl group. When there are multiple $R^7$'s, the $R^7$'s may be the same as or different from each other. $R^8$ represents a hydrogen atom, an alkyl group, an acyl group or an aryl group. When there are multiple $R^8$'s, the $R^8$'s may be the same as or different from each other, m represents an integer of 1 to 3.

$$R^9{}_n R^{10}{}_l Si(OR^{11})_{4-n-l} \qquad (3)$$

In the formula, $R^9$ represents an alkyl group having at least one epoxy group as a part of the chain thereof. When there are multiple $R^9$'s, the $R^9$'s may be the same as or different from each other. $R^{10}$ represents a hydrogen atom, an alkyl group, a heterocyclic group, an aryl group or an alkenyl group. When there are multiple $R^{10}$'s, the $R^{10}$'s may be the same as or different from each other. $R^{11}$ represents a hydrogen atom, an alkyl group, an acyl group or an aryl group. When there are multiple $R^{11}$'s, the $R^{11}$'s may be the same as or different from each other. l represents an integer of 0 to 2, and n represents 1 or 2, provided that 1+n≤3.

The alkyl group mentioned in $R^7$ to $R^{11}$ refers to a saturated aliphatic hydrocarbon group, such as a methyl group, an ethyl group, a n-propyl group, an isopropyl group, a n-butyl group, a sec-butyl group, a tert-butyl group, a cyclopropyl group, a cyclohexyl group, a norbornyl group and an adamantyl group, and may have a substituent or may not have a substituent. The substituent is not particularly limited, and specific examples thereof include an alkoxy group and an aryl group each of which may have a substituent. The number of carbon atoms in the alkyl group is not particularly limited, and is preferably 1 to 20 inclusive, more preferably 1 to 8 inclusive, from the viewpoint of availability and cost. The alkoxy group that is mentioned above as a substituent refers to a functional group having such a structure that one of bonding hands in an ether bond is substituted by an aliphatic hydrocarbon group, and specific examples of the alkoxy group include a methoxy group, an ethoxy group and a propoxy group. The number of carbon atoms in the alkoxy group is not particularly limited, and is preferably 1 to 20 inclusive.

The acyl group mentioned in $R^8$ and $R^{11}$ refers to a functional group having such a structure that one of bonding hands in a carbonyl bond is substituted by an aliphatic hydrocarbon group or an aromatic group each of which may have a substituent or may not have a substituent, and specific examples of the acyl group include an acetyl group, a hexanoyl group and a benzoyl group. The number of carbon atoms in the acyl group is not particularly limited, and is preferably 2 to 40 inclusive.

The aryl group mentioned in $R^7$, $R^8$, $R^{10}$ and $R^{11}$ refers to an aromatic hydrocarbon group such as a phenyl group, a naphthyl group, a biphenyl group, an anthracenyl group, a phenanthryl group, a terphenyl group and a pyrenyl group or an aromatic heterocyclic group such as a furanyl group, a thiophenyl group, a benzofuranyl group, a dibenzofuranyl group, a pyridyl group and a quinolinyl group, and may have a substituent or may not have a substituent. The number of carbon atoms in the aryl group is not particularly limited, and is preferably 3 to 40.

The heterocyclic group mentioned in $R^7$ and $R^{10}$ refers to a group derived from an aliphatic ring that has an atom other than a carbon atom in the ring thereof, such as a pyran ring, a piperidine ring and an amide ring, and may have a substituent or may not have a substituent. The number of carbon atoms in the heterocyclic group is not particularly limited, and is preferably 2 to 20 inclusive.

The alkenyl group mentioned in $R^7$ and $R^{10}$ refers to an unsaturated aliphatic hydrocarbon group containing a double bond, such as a vinyl group, an allyl group and a butadienyl group, and may have a substituent or may not have a substituent. The number of carbon atoms in the alkenyl group is not particularly limited, and is preferably 2 to 20 inclusive.

The alkyl group having an epoxy group as a part of the chain thereof, which is $R^9$, refers to an alkyl group having, as a part of the chain thereof, a three-membered cyclic ether structure formed by bonding adjacent two carbon atoms to one oxygen atom. With respect to this alkyl group, two cases, i.e., a case where adjacent two carbon atoms contained in the main chain (i.e., a moiety in which the length of contiguously placed carbon atoms is largest) are utilized and a case where adjacent two carbon atoms contained in a moiety other than the main chain (i.e., a so-called side chain) are utilized, are included.

When a silane compound represented by general formula (2) is introduced as a polymerization component for the polysiloxane, it becomes possible to form an insulating film that has improved film insulation properties and chemical resistance and is reduced in trapping therein while keeping the transparency thereof in a visible light range.

It is preferred that at least one of m $R^7$'s in general formula (2) is an aryl group, because the flexibility of the insulating film can be improved and the occurrence of cracking in the insulating film can be prevented.

Specific examples of the silane compounds represented by the general formula (2) include vinyltrimethoxysilane, vinyltriethoxysilane, 3-methacryloxypropyltrimethoxysilane, 3-methacryloxypropyltriethoxysilane, methyltrimethoxysilane, methyltriethoxysilane, ethyltrimethoxysilane, ethyltriethoxysilane, propyltrimethoxysilane, propyltriethoxysilane, hexyltrimethoxysilane, octadecyltrimethoxysilane, octadecyltriethoxysilane, phenyltrimethoxysilane, phenyltriethoxysilane, p-tolyltrimethoxysilane, benzyltrimethoxysilane, α-naphthyltrimethoxysilane, β-naphthyltrimethoxysilane, 3-aminopropyltriethoxysilane, N-(2-aminoethyl)-3-aminopropyltrimethoxysilane, 3-chloropropyltrimethoxysilane, dimethyldimethoxysilane, dimethyldiethoxysilane, diphenyldimethoxysilane, diphenyldiethoxysilane, methylphenyldimethoxysilane, methylvinyldimethoxysilane, methylvinyldiethoxysilane, 3-aminopropylmethyldimethoxysilane, N-(2-aminoethyl)-3-aminopropylmethyldimethoxysilane, 3-chloropropylmethyldimethoxysilane, 3-chloropropylmethyldiethoxysilane, cyclohexylmethyldimethoxysilane, 3-methacryloxypropyldimethoxysilane, octadecylmethyldimethoxysilane, trimethoxysilane, trifluoroethyl trimethoxysilane, trifluoroethyl triethoxysilane, trifluoroethyl triisopropoxysilane, trifluoropropyltrimethoxysilane, trifluoropropyltriethoxysilane, trifluoropropyltriisopropoxysilane, heptadecafluorodecyl trimethoxysilane, heptadecafluorodecyl triethoxysilane, heptadecafluorodecyl triisopropoxysilane, tridecafluorooctyl triethoxysilane, tridecafluorooctyl trimethoxysilane, tridecafluorooctyl triisopropoxysilane, trifluoroethylmethyl dimethoxysilane, trifluoroethylmethyl diethoxysilane, trifluoroethylmethyl diisopropoxysilane, trifluoropropylmethyl dimethoxysilane, trifluoropropylmethyl diethoxysilane, trifluoropropylmethyl diisopropoxysilane, heptadecafluorodecyl methyldimethoxysilane, heptadecafluorodecyl methyldiethoxysilane, heptadecafluorodecyl methyldiisopropoxysilane, tridecafluorooctyl methyldimethoxysilane, tridecafluorooctyl methyldiethoxysilane, tridecafluorooctyl methyldiisopropoxysilane, trifluoroethylethyl dimethoxysilane, trifluoroethylethyl diethoxysilane, trifluoroethylethyl diisopropoxysilane, trifluoropropylethyl dimethoxysilane, trifluoropropylethyl diethoxysilane, trifluoropropylethyl diisopropoxysilane, heptadecafluorodecyl ethyldimethoxysilane, heptadecafluorodecyl ethyldiethoxysilane, heptadecafluorodecyl ethyldiisopropoxysilane, tridecafluorooctyl ethyldiethoxysilane, tridecafluorooctyl ethyldimethoxysilane, tridecafluorooctyl ethyldiisopropoxysilane, and p-trifluorophenyltriethoxysilane.

For increasing a crosslinking density and improving chemical resistance and an insulating property, it is preferred to use, among the above-mentioned silane compounds, vinyltrimethoxysilane, vinyltriethoxysilane, methyltrimethoxysilane, methyltriethoxysilane, ethyltrimethoxysilane, ethyltriethoxysilane, propyltrimethoxysilane, propyltriethoxysilane, hexyltrimethoxysilane, octadecyltrimethoxysilane, octadecyltriethoxysilane, phenyltrimethoxysilane, p-tolyltrimethoxysilane, benzyltrimethoxysilane, α-naphthyltrimethoxysilane, β-naphthyltrimethoxysilane, trifluoroethyl trimethoxysilane, trimethoxysilane, or p-trifluorophenyltriethoxysilane, in which m in the general formula (2) is 1. Further, from the viewpoint of the ability of mass production, it is particularly preferred to use vinyltrimethoxysilane, methyltrimethoxysilane, ethyltrimethoxysilane, propyltrimethoxysilane, hexyltrimethoxysilane, octadecyltrimethoxysilane, octadecyltrimethoxysilane, phenyltrimethoxysilane, p-tolyltrimethoxysilane, benzyltrimethoxysilane, α-naphthyltrimethoxysilane, β-naphthyltrimethoxysilane, trifluoroethyl trimethoxysilane, or trimethoxysilane, in which $R^8$ is a methyl group.

One preferred example is a combination of at least two types of the silane compounds represented by general formula (2). A combination of a silane compound having an alkyl group and a silane compound having an aryl group is particularly preferred, because both of high insulation properties and flexibility sufficient for the prevention of occurrence of cracking can be achieved.

Specific examples of the epoxy-group-containing silane compound represented by the general formula (3) include γ-glycidoxypropyltrimethoxysilane, β-(3,4-epoxycyclohexyl)ethyltrimethoxysilane, γ-glycidoxypropyltriethoxysilane, β-(3,4-epoxycyclohexyl)ethyltriethoxysilane, γ-glycidoxypropyltriisopropoxysilane, β-(3,4-epoxycyclohexyl)ethyltriisopropoxysilane,
γ-glycidoxypropylmethyldimethoxysilane, β-(3,4-epoxy cyclohexyl)ethylmethyldimethoxysilane, γ-glycidoxypropylmethyldiethoxysilane, β-(3,4-epoxy cyclohexyl)ethylmethyldiethoxysilane, γ-glycidoxypropylmethyldiisopropoxysilane, β-(3,4-epoxycyclohexyl)ethylmethyldiisopropoxysilane,
γ-glycidoxypropylethyldimethoxysilane, β-(3,4-epoxy cyclohexyl)ethylethyldimethoxysilane, γ-glycidoxypropylethyldiethoxysilane, β-(3,4-epoxy cyclohexyl)ethylethyldiethoxysilane, γ-glycidoxypropylethyldiisopropoxysilane, β-(3,4-epoxy cyclohexyl)ethylethyldiisopropoxysilane, β-(3,4-epoxy cyclohexyl)propyltrimethoxysilane, and γ-glycidoxyethyltrimethoxysilane.

For increasing a crosslinking density and improving chemical resistance and an insulating property, it is preferred to use, among these compounds, γ-glycidoxypropyltrimethoxysilane, β-(3,4-epoxycyclohexyl)ethyltrimethoxysilane, γ-glycidoxypropyltriethoxysilane, β-(3,4-epoxycyclohexyl)ethyltriethoxysilane,
γ-glycidoxypropyltriisopropoxysilane, β-(3,4-epoxycyclohexyl)ethyltriisopropoxysilane, β-(3,4-epoxy cyclohexyl)propyltrimethoxysilane, and γ-glycidoxyethyltrimethoxysilane, in which n is 1 and l is 0 in the general formula (3). Further, from the viewpoint of the ability of mass production, it is particularly preferred to use γ-glycidoxypropyltrimethoxysilane, β-(3,4-epoxycyclohexyl)ethyltrimethoxysilane, β-(3,4-epoxy cyclohexyl)propyltrimethoxysilane, or γ-glycidoxyethyltrimethoxysilane, in which $R^{11}$ is a methyl group.

The metal compound is not particularly limited as long as the metal compound contains a bond between a metal atom and an oxygen atom, and specific examples of the metal compound include a metal oxide, a metal hydroxide and a metal chelate compound. A metal chelate represented by general formula (4) is particularly preferred. The metal atom contained in the metal compound is not particularly limited, and specific examples of the metal atom include magnesium, aluminum, titanium, chromium, manganese, cobalt, nickel, copper, zinc, gallium, zirconium, ruthenium, palladium, indium, hafnium and platinum. Among these metal atoms, aluminum is preferred from the viewpoint of the availability, cost and stability of the metal chelate.

$$R^{12}{}_xM(OR^{13})_{y-x} \quad (4)$$

In the formula, $R^{12}$ represents a monovalent bidentate ligand. When there are multiple $R^{12}$'s, the $R^{12}$'s may be the same as or different from each other. $R^{13}$ represents a hydrogen atom, an alkyl group, an acyl group or an aryl group. When there are multiple $R^{13}$'s, the $R^{13}$'s may be the same as or different from each other. M represents a y-valent metal atom, y represents 1 to 6. x represents an integer of 1 to y.

The monovalent bidentate ligand represented by $R^{12}$ refers to a compound having one group capable of covalently bonding to a metal to be coordinated and one group capable of coordinately bonding to the metal. Specific examples of the group capable of covalently bonding to the metal include groups each of which can covalently bond to the metal atom when deprotonated, such as a hydroxyl group, a mercapto group and a carboxyl group. Specific examples of the group capable of coordinately bonding to the metal include a carbonyl group, a thiocarbonyl group, a nitrile group, an amino group, an imino group and a phosphine oxide group. The number of carbon atoms in $R^{12}$ is not particularly limited, and is preferably 3 to 20 inclusive, more preferably 3 to 12 inclusive, from the viewpoint of thermal degradability during the formation of the film.

The alkyl group mentioned in $R^{13}$ refers to a saturated aliphatic hydrocarbon group, such as a methyl group, an ethyl group, a n-propyl group, an isopropyl group, a n-butyl group, a sec-butyl group, a tert-butyl group, a cyclopropyl group, a cyclohexyl group, a norbornyl group and an adamantyl group, and may have a substituent or may not have a substituent. When the alkyl group has a substituent, the substituent is not particularly limited, and specific examples of the substituent include an alkoxy group and an aryl group. The substituent may have a substituent. The number of carbon atoms in the alkyl group is not particularly limited, and is preferably 1 to 20 inclusive, more preferably 1 to 8 inclusive, from the viewpoint of availability and cost.

The acyl group mentioned in $R^{13}$ refers to a functional group having such a structure that one of bonding hands in a carbonyl bond is substituted by an aliphatic hydrocarbon group or an aromatic group, such as an acetyl group, a hexanoyl group and a benzoyl group. The aliphatic hydrocarbon group or the aromatic group may have a substituent or may not have a substituent. The number of carbon atoms in the acyl group is not particularly limited, and is preferably 2 to 40 inclusive.

The aryl group mentioned in $R^{13}$ refers to an aromatic hydrocarbon group such as a phenyl group, a naphthyl group, a biphenyl group, an anthracenyl group, a phenanthryl group, a terphenyl group and a pyrenyl group or an aromatic heterocyclic group such as a furanyl group, a thiophenyl group, a benzofuranyl group, a dibenzofuranyl group, a pyridyl group and a quinolinyl group, and may have a substituent or may not have a substituent. The number of carbon atoms in the aryl group is not particularly limited, and is preferably 3 to 40.

The alkoxy group that is mentioned above as a substituent refers to a functional group having such a structure that one of bonding hands in an ether bond is substituted by an aliphatic hydrocarbon group, such as a methoxy group, an ethoxy group and a propoxy group. The aliphatic hydrocarbon group may have a substituent or may not have a substituent. The number of carbon atoms in the alkoxy group is not particularly limited, and is preferably 1 to 20 inclusive.

The y-valent metal atom is not particularly limited, as long as the y-valent metal atom can form a metal chelate. Specific examples of the y-valent metal atom include magnesium, aluminum, titanium, chromium, manganese, cobalt, nickel, copper, zinc, gallium, zirconium, ruthenium, palladium, indium, hafnium and platinum. Y represents 1 to 6, and can be specified depending on the types of the metal atoms. Among these metal atoms, a metal selected from the group consisting of aluminum, titanium, zirconium and indium is preferred, from the viewpoint of availability and cost.

Among metal chelates, an aluminum chelate represented by general formula (5) is preferred, because the aluminum chelate has excellent stability.

$$R^{12}{}_3Al \qquad (5)$$

In the formula, $R^{12}$ is as defined in general formula (4), and the multiple $R^{12}$'s may be the same as or different from each other.

In general formulae (4) and (5), the monovalent bidentate ligand represented by $R^{12}$ is particularly preferably a group derived from a β-diketone or a group derived from a β-ketoester, because these compounds are available at low cost and enable the stable formation of chelates.

Specific examples of the β-diketone include 2,4-pentanedione, 2,4-hexanedione, 2,4-heptanedione, 3,5-heptanedione, 2,4-octanedione, 3,5-octanedione, 2,4-decanedione, 2,4-dodecanedione, 2,6-dimethyl-3,5-heptanedione, 2,2,6-trimethyl-3,5-heptanedione, 2,2,6,6-tetramethyl-3,5-heptanedione, 2,2,6,6-tetramethyl-3,5-octanedione, 3-methyl-2,4-pentanedione, 3-ethyl-3,5-heptanedione, benzoylacetone, dibenzoylmethane, 1-(pyridyl-2-yl)-1,3-butanedione, 1-(pyridyl-2-yl)-2,5-pentanedion, and 1-amino-2,4-pentanedione.

Specific examples of the β-ketoester include methyl acetoacetate, ethyl acetoacetate, isopropyl acetoacetate, t-butyl acetoacetate, n-butyl acetoacetate, phenyl acetoacetate, ethyl propanoylacetate, ethyl butanoylacetate, ethyl pentanoylacetate, ethyl hexanoylacetate, ethyl octanoylacetate, ethyl decanoylacetate, ethyl dodecanoylacetate, ethyl-2-methylpropanoylacetate, ethyl-2,2-dimethylbutanoylacetate, ethyl benzoylacetate, ethyl-p-anisoylacetate, ethyl-2-pyridyloylacetate, ethyl acrylylacetate, 1-aminobutanoylacetate, and ethyl-α-acetyl propanoate.

In the aluminum chelate represented by general formula (5), it is preferred that at least one of three $R^{12}$'s is different from the other two $R^{12}$'s, from the viewpoint of the solubility of the chelate in a solvent and the stability of the composition. For the similar reasons, it is preferred that at least one of the $R^{12}$'s is a β-ketoester.

Specific examples of the metal chelate include the following compounds. Examples of the aluminum chelates include diethoxy aluminum (2,4-pentanedionato), diisopropoxy aluminum (2,4-pentanedionato), diethoxy aluminum (2,4-hexanedionato), diethoxy aluminum (3,5-hexanedionato), diethoxy aluminum (2,4-octanedionato), diethoxy aluminum benzoylacetonate, diethoxy aluminum (1-(pyridyl-2-yl)-1,3-butanedionato), diethoxy aluminum (methyl acetoacetate), diisopropoxy aluminum(methyl acetoacetate), diethoxy aluminum (ethyl acetoacetate), diethoxy aluminum (isopropyl acetoacetate), diethoxy aluminum-(t-butyl acetoacetate), diethoxy aluminum (ethyl butanoylacetate), diethoxy aluminum (ethyl benzoylacetate), ethoxy aluminum bis(2,4-pentanedionato), isopropoxy aluminum bis(2,4-pentanedionato), ethoxy aluminum bis(2,4-hexanedionato), ethoxy aluminum bis(3,5-hexanedionato), ethoxy aluminum bis(2,4-octanedionato), ethoxy aluminum bis(benzoyl acetonato), ethoxy aluminum bis(1-(pyridyl-2-yl)-1,3-butanedionato), ethoxy aluminum bis(ethyl acrylyl acetate), ethoxy aluminum bis(methyl acetoacetate), isopropoxy aluminum bis(methyl acetoacetate), ethoxy aluminum bis(ethyl acetoacetate), ethoxy aluminum bis(isopropyl acetoacetate), ethoxy aluminum bis(t-butyl acetoacetate), ethoxy aluminum bis(ethyl butanoyl acetate), ethoxy aluminum bis(ethyl benzoylacetate), ethoxy aluminum bis(ethyl acrylyl acetate), aluminum tris(2,4-pentanedionato), aluminum tris(1,1,3,-tetrafluoro-2,4-pentanedionato), aluminum tris(2,4-hexanedionato), aluminum tris(3,5-hexanedionato), aluminum tris(2,4-octanedionato), aluminum tris(benzoyl acetonate), aluminum tris(1-(pyridyl-2-yl)-1,3-butanedionato), aluminum tris(2,6-dimethyl-3,5-heptanedionato), aluminum tris(2,2,6-trimethyl-3,5-heptanedionato), aluminum tris(2,2,6,6-tetramethyl-3,5-octanedionato), aluminum tris(1-amino-2,4-pentanedionato), aluminum tris(methyl acetoacetate), aluminum tris(ethyl acetoacetate), aluminum tris(isopropyl acetoacetate), aluminum tris(t-butyl acetoacetate), aluminum tris(ethyl butanoylacetate), aluminum tris(ethyl pentanoylacetate), aluminum tris(ethyl-2-methylpropanoylacetate), aluminum tris(ethyl benzoylacetate), aluminum tris(ethyl-2-pyridyloylacetate), aluminum tris(1-aminobutanoylacetate), aluminum tris(ethyl-α-acetyl propanoate), aluminum tris(ethyl acrylyl acetate), ethoxy aluminum mono(ethyl acetoacetate)mono(isopropyl acetoacetate), ethoxy aluminum mono(ethyl acetoacetate)mono(3,5-hexanedionato), aluminum bis(ethyl acetoacetate) mono(isopropyl acetoacetate), aluminum bis(ethyl acetoacetate)mono(3,5-hexanedionato), aluminum tris(diethyl malonate), aluminum tris(dioctyl malonate), aluminum tris (diethyl(methylmalonate)), aluminum tris(diethyl(phenyl malonate)), aluminum tris(ethyl thioacetoacetate), aluminum tris(2-acetyl phenolate), and aluminum tris(2-(pyridine-2-yl)phenolate).

Examples of the zirconium chelates include trisethoxy zirconium (2,4-pentanedionato), trisisopropoxy zirconium (2,4-pentanedionato), trisethoxy zirconium (2,4-hexanedionato), trisethoxy zirconium (3,5-hexanedionato), trisethoxy zirconium benzoylacetonate, trisethoxy zirconium(methyl acetoacetate), trisisopropoxy zirconium(methyl acetoacetate), trisethoxy zirconium (ethyl acetoacetate), trisethoxy zirconium (isopropyl acetoacetate), trisethoxy zirconium-(t-butyl acetoacetate), trisethoxy zirconium (ethyl butanoylacetate), trisethoxy zirconium (ethyl benzoylacetate), diethoxy zirconium bis(2,4-pentanedionato), diisopropoxy zirconium bis(2,4-pentanedionato), diethoxy zirconium bis(2,4-hexanedionato), diethoxy zirconium bis (3,5-hexanedionato), diethoxy zirconium bis(benzoyl acetonato), diethoxy zirconium bis(methyl acetoacetate), diisopropoxy zirconium bis(methyl acetoacetate), diethoxy zirconium bis(ethyl acetoacetate), diethoxy zirconium bis (isopropyl acetoacetate), diethoxy zirconium bis(t-butyl acetoacetate), diethoxy zirconium bis(ethyl butanoyl acetate), diethoxy zirconium bis(ethyl benzoylacetate), ethoxy zirconium tris(2,4-pentanedionato), isopropoxy zirconium tris(2,4-pentanedionato), ethoxy zirconium tris(2,4-hexanedionato), ethoxy zirconium tris(3,5-hexanedionato), ethoxy zirconium tris(benzoylacetonate), ethoxy zirconium tris(methyl acetoacetate), isopropoxy zirconium tris(methyl acetoacetate), ethoxy zirconium tris(ethyl acetoacetate), ethoxy zirconium tris(isopropyl acetoacetate), ethoxy zirconium tris(t-butyl acetoacetate), ethoxy zirconium tris(ethyl butanoylacetate), ethoxy zirconium tris(ethyl benzoylacetate), zirconium tetrakis(2,4-pentanedionato), zirconium tetrakis(2,4-hexanedionato), zirconium tetrakis(3,5-hexanedionato), zirconium tetrakis(benzoyl acetonate), zirconium tetrakis(2,6-dimethyl-3,5-heptanedionato), zirconium tetrakis(2,2,6-trimethyl-3,5-heptanedionato), zirconium tetrakis (methyl acetoacetate), zirconium tetrakis(ethyl acetoacetate), zirconium tetrakis(isopropyl acetoacetate), zirconium tetrakis(t-butyl acetoacetate), zirconium tetrakis(ethyl butanoylacetate), zirconium tetrakis(ethyl-2-methylpropanoylacetate), zirconium tetrakis(ethyl benzoylacetate), zirconium tetrakis(diethyl malonate), zirconium tetrakis(diethyl(methyl malonate)), ethoxy zirconium bis(ethyl acetoacetate)mono(isopropyl acetoacetate), ethoxy zirconium bis(ethyl acetoacetate)mono(3,5-hexanedionato), zirconium bis(ethyl acetoacetate)bis(isopropyl acetoacetate), and zirconium tris(ethyl acetoacetate)mono(3,5-hexanedionato).

Examples of the titanium chelates include trisethoxy titanium (2,4-pentanedionato), trisisopropoxy titanium (2,4-pentanedionato), trisethoxy titanium (2,4-hexanedionato), trisethoxy titanium (3,5-hexanedionato), trisethoxy titanium benzoylacetonate, trisethoxy titanium(methyl acetoacetate), trisisopropoxy titanium(methyl acetoacetate), trisethoxy titanium (ethyl acetoacetate), trisethoxy titanium (isopropyl acetoacetate), trisethoxy titanium (t-butyl acetoacetate), trisethoxy titanium (ethyl butanoylacetate), trisethoxy titanium (ethyl benzoylacetate), diethoxy titanium bis(2,4-pentanedionato), diisopropoxy titanium bis(2,4-pentanedionato), diethoxy titanium bis(2,4-hexanedionato), diethoxy titanium bis(3,5-hexanedionato), diethoxy titanium bis(benzoyl acetonato), diethoxy titanium bis(methyl acetoacetate), diisopropoxy titanium bis(methyl acetoacetate), diethoxy titanium bis(ethyl acetoacetate), diethoxy titanium bis(isopropyl acetoacetate), diethoxy titanium bis(t-butyl acetoacetate), diethoxy titanium bis(ethyl butanoyl acetate), diethoxy titanium bis(ethyl benzoylacetate), ethoxy titanium tris(2,4-pentanedionato), isopropoxy titanium tris(2,4-pentanedionato), ethoxy titanium tris(2,4-hexanedionato), ethoxy titanium tris(3,5-hexanedionato), ethoxy titanium tris(benzoylacetonate), ethoxy titanium tris(methyl acetoacetate), isopropoxy titanium tris(methyl acetoacetate), ethoxy titanium tris(ethyl acetoacetate), ethoxy titanium tris(isopropyl acetoacetate), ethoxy titanium tris(t-butyl acetoacetate), ethoxy titanium tris(ethyl butanoylacetate), ethoxy titanium tris(ethyl benzoylacetate), titanium tetrakis(2,4-pentanedionato), titanium tetrakis(2,4-hexanedionato), titanium tetrakis(3,5-hexanedionato), titanium tetrakis(benzoyl acetonate), titanium tetrakis(2,6-dimethyl-3,5-heptanedionato), titanium tetrakis(2,2,6-trimethyl-3,5-heptanedionato), titanium tetrakis(methyl acetoacetate), titanium tetrakis(m-ethyl acetoacetate), titanium tetrakis(ethyl acetoacetate), titanium tetrakis(isopropyl acetoacetate), titanium tetrakis(t-butyl acetoacetate), titanium tetrakis(ethyl butanoylacetate), titanium tetrakis(ethyl-2-methylpropanoylacetate), titanium tetrakis(ethyl benzoylacetate), titanium tetrakis(diethyl malonate), titanium tetrakis(dioctyl malonate), titanium tetrakis(diethyl(methyl malonate)), ethoxy titanium bis(ethyl acetoacetate)mono(3,5-hexanedionato), titanium bis(ethyl acetoacetate)bis(isopropyl acetoacetate), and titanium tris (ethyl acetoacetate)mono(3,5-hexanedionato).

Examples of the indium chelates include diethoxy indium (2,4-pentanedionato), diisopropoxy indium (2,4-pentanedionato), diethoxy indium (2,4-hexanedionato), diethoxy indium (3,5-hexanedionato), diethoxy indium benzoylacetonate, diethoxy indium(methyl acetoacetate), diisopropoxy indium(methyl acetoacetate), diethoxy indium (ethyl acetoacetate), diethoxy indium (isopropyl acetoacetate), diethoxy indium (t-butyl acetoacetate), diethoxy indium (ethyl butanoylacetate), diethoxy indium (ethyl benzoylacetate), ethoxy indium bis(2,4-pentanedionato), isopropoxy indium bis(2,4-pentanedionato), ethoxy indium bis(2,4-hexanedionato), ethoxy indium bis(3,5-hexanedionato), ethoxy indium bis(benzoyl acetonato), ethoxy indium bis(methyl acetoacetate), isopropoxy indium bis(methyl acetoacetate), ethoxy indium bis(ethyl acetoacetate), ethoxy indium bis(isopropyl acetoacetate), ethoxy indium bis(t-butyl acetoacetate), ethoxy indium bis(ethyl butanoyl acetate), ethoxy indium bis(ethyl benzoylacetate), indium tris(2,4-pentanedionato), indium tris(2,4-hexanedionato), indium tris(3,5-hexanedionato), indium tris(benzoylacetonate), indium tris(2,6-dimethyl-3,5-heptanedionato), indium tris(2,2,6-trimethyl-3,5-heptanedionato), indium tris(methyl acetoacetate), indium tris(ethyl acetoacetate), indium tris (isopropyl acetoacetate), indium tris(t-butyl acetoacetate), indium tris(ethyl butanoylacetate), indium tris(ethyl-2-methylpropanoylacetate), indium tris(ethyl benzoylacetate), indium tris(diethyl malonate), indium tris(dioctyl malonate), and indium tris(diethyl(methyl malonate)).

Examples of the magnesium chelates include magnesium bis(2,4-pentanedionato) and magnesium bis(ethyl acetoacetate).

Examples of the chromium chelates include chromium tris(2,4-pentanedionato) and chromium tris(ethyl acetoacetate).

Examples of the manganese chelates include manganese (II) bis(2,4-pentanedionato), manganese (II) bis(ethyl acetoacetate), manganese (III) tris(2,4-pentanedionato) and manganese (III) tris(ethyl acetoacetate).

Examples of the cobalt chelates include cobalt tris(2,4-pentanedionato) and cobalt tris(ethyl acetoacetate).

Examples of the nickel chelates include nickel bis(2,4-pentanedionato) and nickel bis(ethyl acetoacetate).

Examples of the copper chelates include copper bis(2,4-pentanedionato) and copper bis(ethyl acetoacetate).

Examples of the zinc chelates include zinc bis(2,4-pentanedionato) and zinc bis(ethyl acetoacetate).

Examples of the gallium chelates include gallium tris(2,4-pentanedionato) and gallium tris(ethyl acetoacetate).

Examples of the ruthenium chelates include ruthenium tris(2,4-pentanedionato) and ruthenium tris(ethyl acetoacetate).

Examples of the palladium chelates include palladium bis(2,4-pentanedionato) and palladium bis(ethyl acetoacetate).

Examples of the hafnium chelates include hafnium tetrakis(2,4-pentanedionato) and hafnium tetrakis(ethyl acetoacetate).

Examples of the platinum chelates include platinum bis (2,4-pentanedionato) and platinum bis(ethyl acetoacetate).

The metal chelate can be produced in, for example, the following manner. A specified amount of a ligand is dropwisely added to a metal alkoxide, and the resultant mixture is subjected to reflux under heating to distil away an alcohol component derived from the alkoxide. In this manner, a desired metal chelate can be synthesized. Alternatively at least two types of ligands may be dropwisely added successively. In this case, a metal chelate having different ligands can be produced.

In the insulating layer 5, it is preferred that the metal atom is contained in an amount of 10 to 180 parts by mass relative to the total amount, i.e., 100 parts by mass, of carbon atoms and silicon atoms. When the content of the metal atom falls within this range, it becomes possible to improve insulating properties. The ratio of the mass of the metal atom to the total mass, i.e., 100 parts by mass, of carbon atoms and silicon atoms in the insulating layer can be determined by X-ray photoelectron spectroscopy (XPS).

The thickness of the insulating layer 5 is preferably 0.05 to 5 µm, more preferably 0.1 to 1 µm. When the thickness falls within this range, it becomes possible to form a uniform thin film easily. The thickness can be determined, for example, with an atomic force microscope or by an ellipsometric method.

The method for producing the insulating layer is not particularly limited. For example, the insulating layer can be formed by applying a raw material composition onto a substrate, then drying the raw material composition to produce a coating film, and optionally subjecting the coating film to a thermal treatment, thereby forming the insulating layer. As the method for the application, known coating methods, such as a spin coating method, a blade coating method, a slit die coating method, a screen printing method, a bar coater method, a template method, a print transfer method, a dipping-withdrawing method and an inkjet method can be mentioned. The temperature to be employed for the thermal treatment of the coating film is preferably 100 to 300° C. For example, in the case where a raw material composition which contains an aluminum chelate, a polysiloxane and a solvent and contains the polysiloxane in an amount of 5 to 90 parts by mass relative to 100 parts by mass of the aluminum chelate is used, an insulating layer containing the aluminum atom in an amount of 10 to 180 parts by mass relative to the total amount, i.e., 100 parts by mass, of carbon atoms and silicon atoms can be formed.

The above-mentioned relationship with respect to the ratio between the contents of the atoms in the composition and the insulating layer is just a rough tendency, and the above-mentioned relationship is not always satisfied depending on the types of the metal atom and the like.

The insulating layer may be composed of a single layer or multiple layers. Alternatively, a single layer is made from multiple types of insulating materials, or multiple types of insulating materials may be laminated to form multiple insulating layers.

(CNT Composite)

The CNT composite is configured such that a conjugated polymer is adhered onto at least a part of the surface of a CNT. The term "conjugated polymer" as used herein refers to a compound in which each repeating unit has a conjugated structure and which has a degree of polymerization of 2 or more. The state where a conjugated polymer is adhered onto at least a part of the surface of a CNT refers to a state where a part or the whole of the surface of the CNT is coated with the conjugated polymer. The reason why a conjugated polymer can coat a CNT is assumed that an interaction occurs as the result of the overlapping of n-electron clouds originated from the conjugated structures of the conjugated polymer and the CNT. Weather a CNT is coated with the conjugated polymer can be determined on the basis of a fact that the reflected color of a coated CNT comes close to the color of the conjugated polymer from the color of an uncoated CNT. Alternatively, as a quantitative manner, the presence of an adhered matter and the ratio of the mass of the adhered matter to the mass of the CNT may be determined by an elementary analysis such as X-ray photoelectron spectroscopy (XPS).

From the viewpoint of adherability of the conjugated polymer onto CNTs, it is preferred that the conjugated polymer has a weight average molecular weight of 1000 or more.

The CNT composite is configured such that the conjugated polymer is adhered onto at least a part of the surface of a CNT. Therefore, it becomes possible to uniformly disperse the CNTs in a solution without deteriorating the high electric properties of the CNTs. A CNT film having CNTs dispersed therein uniformly can be formed by a coating method using a dispersion having the CNTs dispersed therein uniformly. In this manner, high semiconductor properties can be achieved.

Examples of the method for adhering the conjugated polymer onto CNTs include: (I) a method in which CNTs are added to and mixed with the conjugated polymer that is in a molted state; (II) a method in which the conjugated polymer is dissolved in a solvent and then CNTs are added to and mixed with the resultant solution; (III) a method in which CNTs are dispersed previously in a solvent with ultrasonic waves or the like and then the conjugated polymer is added to and mixed with the resultant solution; and (IV) a method in which the conjugated polymer and CNTs are added to a solvent and then ultrasonic waves or the like are applied to the resultant mixed system to stir the system. In the present invention, any one of the above-mentioned methods may be employed, or two or more of the methods may be employed in combination.

Specific examples of the conjugated polymer include, but not particularly limited to, a polythiophene polymer, a polypyrrole polymer, a polyaniline polymer, a polyacethylene polymer, a poly-p-phenylene polymer and a poly-p-phenylene vinylene polymer. The polymer that is preferably used is one in which a single type of monomer units lie on a line. The polymer to be used may also be one in which different types of monomer units are block-copolymerized, randomly copolymerized or graft-polymerized.

Among the above-mentioned polymers, a polythiophene polymer is preferably used, because this polymer can be adhered onto CNTs easily and CNT composites can be formed easily. The polythiophene polymer is more preferably one containing, in the repeating units thereof, both a condensed heteroaryl unit having a nitrogenated double bond in the ring thereof and a thiophene unit. Specific examples of the condensed heteroaryl unit having a nitrogenated double bond in the ring thereof include a thienopyrrole unit, a pyrrolothiazole unit, a pyrrolopyridazine unit, a benzimidazole unit, a benzotriazole unit, a benzoxazole unit, a benzothiazole unit, a benzothiadiazole unit, a quinoline unit, a quinoxaline unit, a benzotriazine unit, a thienooxazole unit, a thienopyridine unit, a thienothiazine unit and a thienopyrazine unit. Among these units, a benzothiadiazole unit or a quinoxaline unit is particularly preferred. When these units are contained, the adhesion between the CNTs and the conjugated polymer can be further improved and the CNTs can be dispersed in the semiconductor layer more satisfactorily.

As the conjugated polymer, a conjugated polymer having the following structure is particularly preferred.

[chemical formula 1]

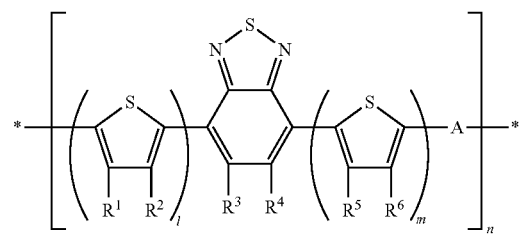

In the formula, $R^1$ to $R^6$ may be the same as or different from each other and respectively represent a hydrogen atom, an alkyl group, a cycloalkyl group, a heterocyclic group, an alkenyl group, a cycloalkenyl group, an alkynyl group, an alkoxy group, an alkylthio group, an aryl ether group, an aryl thioether group, an aryl group, a heteroaryl group, a halogen atom, a cyano group, a formyl group, a carbamoyl group, an amino group, an alkylcarbonyl group, an arylcarbonyl group, a carboxyl group, an alkoxycarbonyl group, an aryloxycarbonyl group, an alkylcarbonyloxy group, an aryl carbonyl oxy group or a silyl group. Adjacent two of $R^1$ to $R^6$ may together form a ring structure. A is selected from a single bond, an arylene group, a heteroarylene group other than a thienylene group, an ethenylene group, and an ethynylene group. l and m respectively represent an integer of 0 to 10, provided that $1+m \geq 1$. n represents 2 to 1000. When each of l, m and n is 2 or greater, each of $R^1$'s to $R^6$'s and A's may be the same as or different from each other.

The alkyl group refers to a saturated aliphatic hydrocarbon group such as a methyl group, an ethyl group, a n-propyl group, an isopropyl group, a n-butyl group, a sec-butyl group and a tert-butyl group, and may have a substituent or may not have a substituent. In the case where the alkyl group has a substituent, the substituent is not particularly limited and specific examples of the substituent include an alkoxy group, an aryl group and a heteroaryl group. The substituent may have a substituent. The number of carbon atoms in the alkyl group is not particularly limited, and is preferably 1 to 20 inclusive, more preferably 1 to 8 inclusive, from the viewpoint of availability and cost.

The cycloalkyl group refers to a saturated alicyclic hydrocarbon group, such as a cyclopropyl group, a cyclohexyl group, a norbornyl group and an adamantyl group, and may have a substituent or may not have a substituent. In the case where the cycloalkyl group has a substituent, the substituent is not particularly limited, and specific examples of the substituet include an alkyl group, an alkoxy group, an aryl group and a heteroaryl group. The substituent may have a substituent. The explanations for the substituent can apply to the statements below, unless otherwise specified. The number of carbon atoms in the cycloalkyl group is not particularly limited, and is preferably 3 to 20 inclusive.

The heterocyclic group refers to a group derived from an aliphatic ring having an atom other than a carbon atom in the ring thereof, such as a pyran ring, a piperidine ring and an amide ring, and may have a substituent or may not have a substituent. The number of carbon atoms in the heterocyclic group is not particularly limited, and is preferably 2 to 20 inclusive.

The alkenyl group refers to an unsaturated aliphatic hydrocarbon group containing a double bond, such as a vinyl group, an aryl group and a butadienyl group, and may have a substituent or may not have a substituent. The number of carbon atoms in the alkenyl group is not particularly limited, and is preferably 2 to 20 inclusive.

The cycloalkenyl group refers to an unsaturated alicyclic hydrocarbon group containing a double bond, such as a cyclopentenyl group, a cyclopentadienyl group and a cyclohexenyl group, and may have a substituent or may not have a substituent. The number of carbon atoms in the cycloalkenyl group is not particularly limited, and is preferably 3 to 20 inclusive.

The alkynyl group refers to an unsaturated aliphatic hydrocarbon group containing a triple bond, such as an ethynyl group, and may have a substituent or may not have a substituent. The number of carbon atoms in the alkynyl group is not particularly limited, and is preferably 2 to 20 inclusive.

The alkoxy group refers to a functional group having such a structure that one of bonding hands in an ether bond is substituted by an aliphatic hydrocarbon group, such as a methoxy group, an ethoxy group and a propoxy group, and may have a substituent or may not have a substituent. The number of carbon atoms in the alkoxy group is not particularly limited, and is preferably 1 to 20 inclusive.

The alkylthio group refers to a group having such a structure that an oxygen atom in an ether bond in an alkoxy group is substituted by a sulfur atom, and may have a substituent or may not have a substituent. The number of carbon atoms in the alkylthio group is not particularly limited, and is preferably 1 to 20 inclusive.

The aryl ether group refers to a functional group having such a structure that one of bonding hands in an ether bond is substituted by an aromatic hydrocarbon group, such as a phenoxy group and a naphthoxy group, and may have a substituent or may not have a substituent. The number of carbon atoms in the aryl ether group is not particularly limited, and is preferably 6 to 40 inclusive.

The aryl thioether group refers to a group having such a structure that an oxygen atom in an ether bond in an aryl ether group is substituted by a sulfur atom, and may have a substituent or may not have a substituent. The number of carbon atoms in the aryl thioether group is not particularly limited, and is preferably 6 to 40 inclusive.

The aryl group refers to an aromatic hydrocarbon group such as a phenyl group, a naphthyl group, a biphenyl group, an anthracenyl group, a phenanthryl group, a terphenyl group and a pyrenyl group, and may have a substituent or may not have a substituent. The number of carbon atoms in the aryl group is not particularly limited, and is preferably 6 to 40 inclusive.

The heteroaryl group refers to an aromatic group having such a structure that one or multiple atoms other than carbon atoms are contained in the ring thereof, such as a furanyl group, a thiophenyl group, a benzofuranyl group, a dibenzofuranyl group, a pyridyl group and a quinolinyl group, and may have a substituent or may not have a substituent. The number of carbon atoms in the heteroaryl group is not particularly limited, and is preferably 2 to 30 inclusive.

The halogen atom refers to a fluorine atom, a chlorine atom, a bromine atom or an iodine atom.

The alkylcarbonyl group refers to a functional group having such a structure that one of bonding hands in a carbonyl bond is substituted by an aliphatic hydrocarbon group, such as an acetyl group and a hexanoyl group, and may have a substituent or may not have a substituent. The number of carbon atoms in the alkylcarbonyl group is not particularly limited, and is preferably 2 to 20 inclusive.

The arylcarbonyl group refers to a functional group having such a structure that one of bonding hands in a carbonyl bond is substituted by an aromatic hydrocarbon group, such as a benzoyl group, and may have a substituent or may not have a substituent. The number of carbon atoms in the arylcarbonyl group is not particularly limited, and is preferably 7 to 40 inclusive.

The alkoxycarbonyl group refers to a functional group having such a structure that one of bonding hands in a carbonyl group is substituted by an alkoxy group, such as a methoxycarbonyl group, and may have a substituent or may not have a substituent. The number of carbon atoms in the alkoxycarbonyl group is not particularly limited, and is preferably 2 to 20 inclusive.

The aryloxycarbonyl group refers to a functional group having such a structure that one of bonding hands in a carbonyl bond is substituted by an aryloxy group, such as a phenoxycarbonyl group, and may have a substituent or may not have a substituent. The number of carbon atoms in the aryloxycarbonyl group is not particularly limited, and is preferably 7 to 40 inclusive.

The alkylcarbonyloxy group refers to a functional group having such a structure that one of bonding hands in an ether bond is substituted by an alkylcarbonyl group, such as an acetoxy group, and may have a substituent or may not have a substituent. The number of carbon atoms in the alkylcarbonyloxy group is not particularly limited, and is preferably 2 to 20 inclusive.

The arylcarbonyloxy group refers to a functional group having such a structure that one of bonding hands in an ether bond is substituted by an arylcarbonyl group, such as a benzoyloxy group, and may have a substituent or may not have a substituent. The number of carbon atoms in the arylcarbonyloxy group is not particularly limited, and is preferably 7 to 40 inclusive.

Each of the carbamoyl group, the amino group and the silyl group may have a substituent or may not have a substituent. In the case where each of the groups have a substituent, specific examples of the substituent include an alkyl group, a cycloalkyl group, an aryl group and heteroaryl group, and the substituent may have a substituent.

A case where adjacent two groups together form a ring structure will be described. For example, in general formula (1), $R^1$ and $R^2$ together form a conjugated or non-conjugated condensed ring. As the constituent elements of the condensed ring, a nitrogen atom, an oxygen atom, a sulfur atom, a phosphorus atom or a silicon atom may be contained in addition to a carbon atom. The condensed ring may be condensed with another ring.

Next, A in general formula (1) will be described. The arylene group refers to an aromatic hydrocarbon group having a valency of 2 (i.e., having two bonding sites), and may be unsubstituted or substituted. The number of carbon atoms in the arylene group is not particularly limited, and is preferably 1 to 50 inclusive. Specific examples of a substituent to be used in the case where the arylene group is substituted include the above-mentioned alkyl group, a heteroaryl group and a halogen atom. Preferred specific examples of the arylene group include a phenylene group, a naphthylene group, a biphenylene group, a phenanthrylene group, an anthrylene group, a terphenylene group, a pyrenylene group, a fluorenylene group and a perylenylene group.

The heteroarylene group refers to a bivalent heteroaromatic ring group and may be unsubstituted or substituted. The number of carbon atoms in the heteroarylene group is not particularly limited, and is preferably 1 to 50 inclusive. Preferred specific examples of the heteroarylene group include a pyridylene group, a pyrazylene group, a quinolinylene group, an isoquinolinylene group, a quinoxalinylene group, an acridinylene group, an indolinylene group and a carbazolinylene group, and also include bivalent groups derived from heteroaromatic rings such as benzofuran, dibenzofuran, benzothiophene, dibenzothiophene, benzodithiophene, benzosilole and dibenzosilole.

In general formula (1), l and m respectively represent an integer of 0 to 10, provided that l+m≥1. When a thiophene unit is contained in the structure, the adhesion to the CNTs can be improved, resulting in the improvement in the dispersibility of the CNTs. Therefore, it is preferred that each of l and m is 1 or more, and it is more preferred that l+m≥4. From the viewpoint of the ease of the synthesis of the monomer and the subsequent polymerization of the monomer, it is preferred that l+m≤12.

n represents the degree of polymerization of the conjugated polymer, and is 2 to 1000. From the viewpoint of the ease of the adhesion to the CNTs, n is preferably 3 to 500. In the present invention, the degree of polymerization n is a value calculated from a weight average molecular weight. The weight average molecular weight is measured by GPC (gel permeation chromatography) and is then converted using a polystyrene standard sample.

From the viewpoint of the ease of the formation of the CNT composite, the conjugated polymer is preferably soluble in a solvent. Therefore, it is preferred that at least one of $R^1$ to $R^6$ is an alkyl group.

Specific examples of the conjugated polymer include polymers having the following structures.

[chemical formula 2]

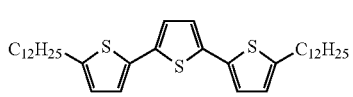

[1]

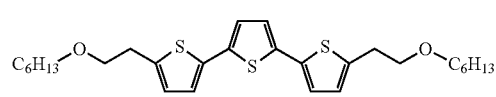

[2]

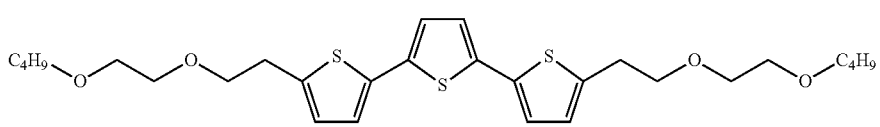

[3]

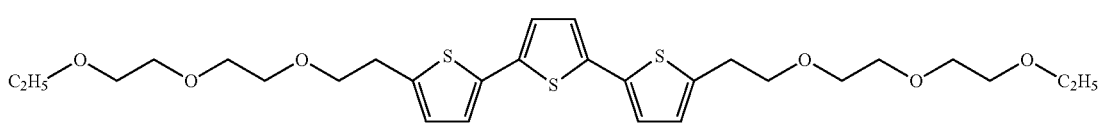

[4]

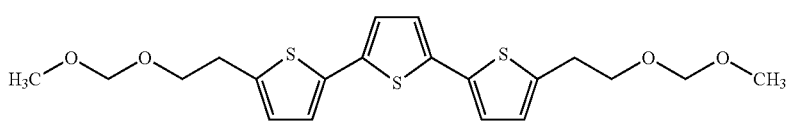

[5]

-continued
[6]
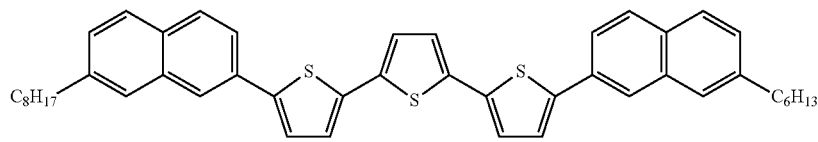
[7]
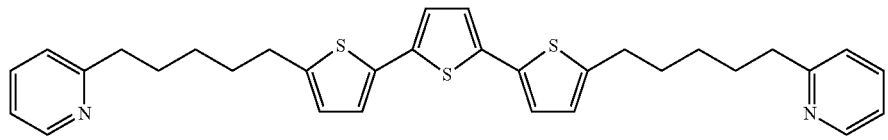
[8]
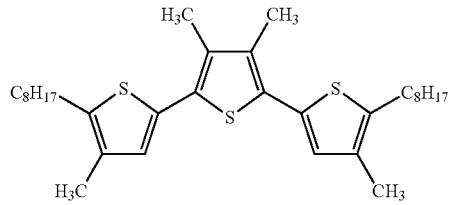
[9]
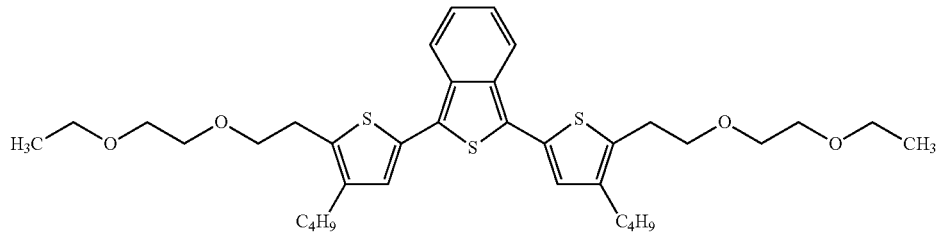
[chemical formula 3]
[10]
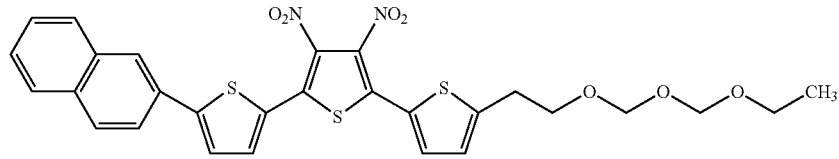
[11]
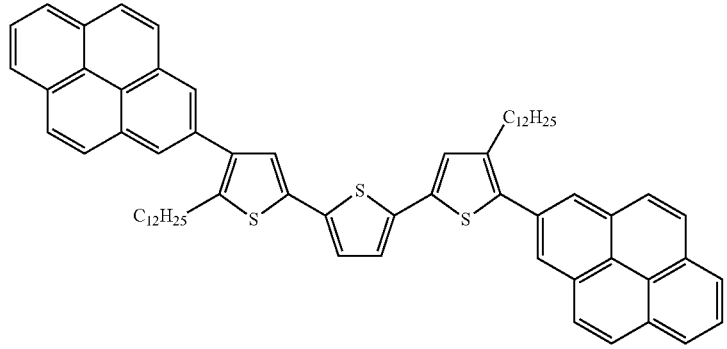
[12]
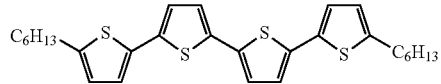
[13]
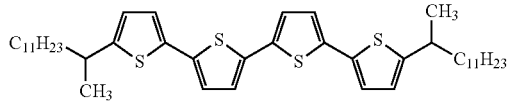
[14]
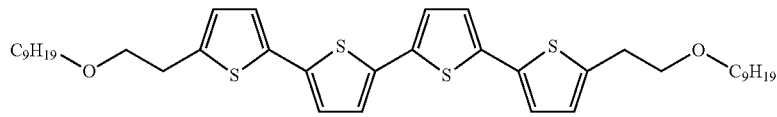

-continued
[15]
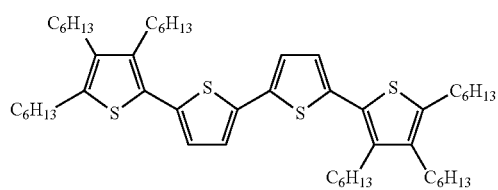
[16]
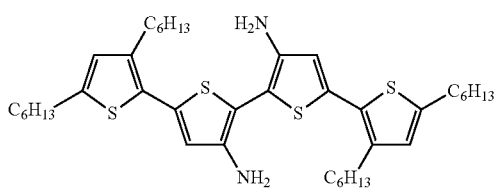
[17]
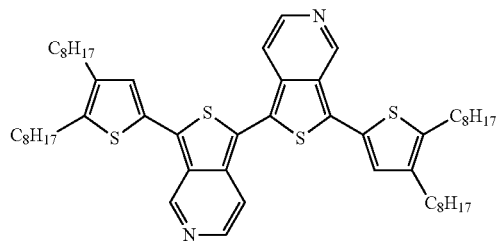
[chemical formula 4]
[18]
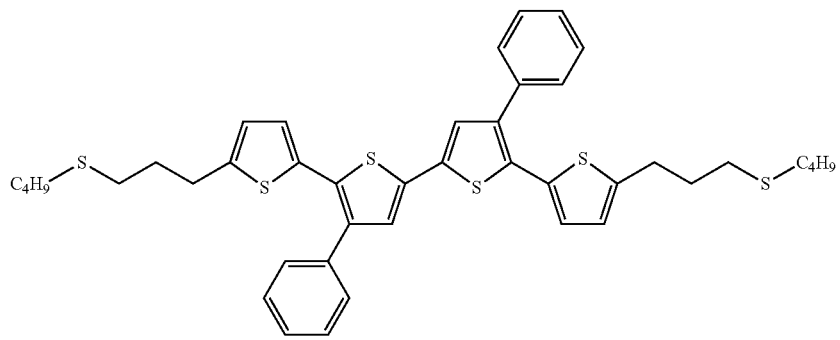
[19]
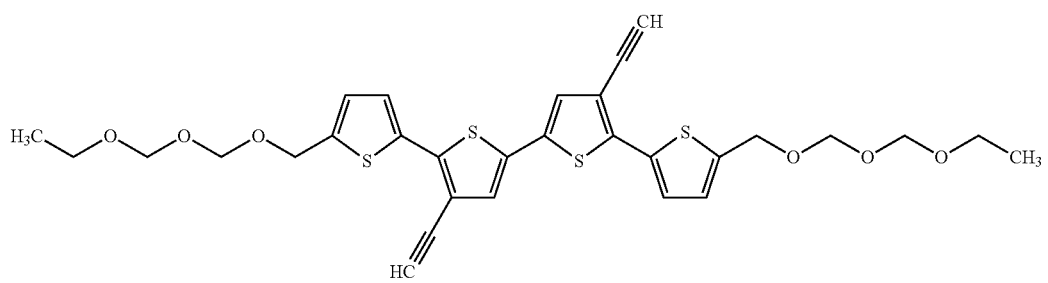
[20]
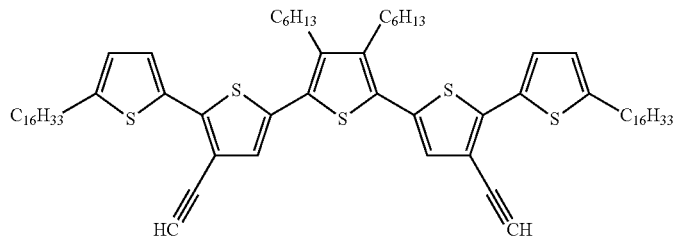
[21]
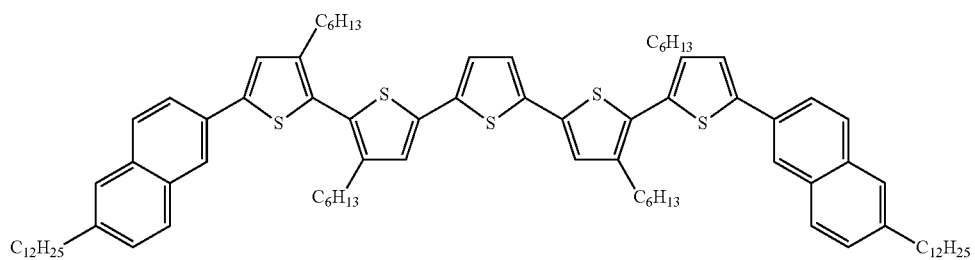

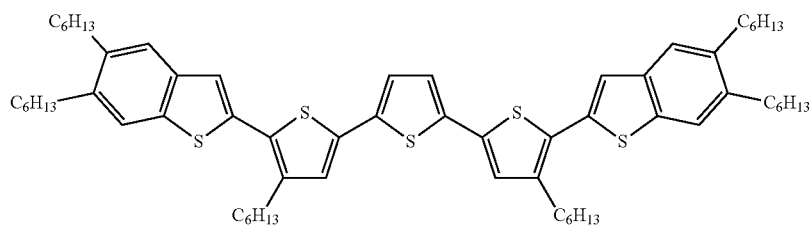
[22]
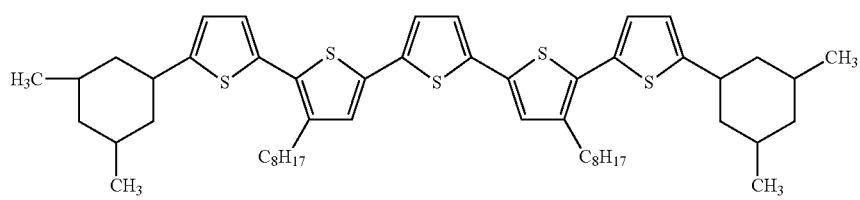
[23]
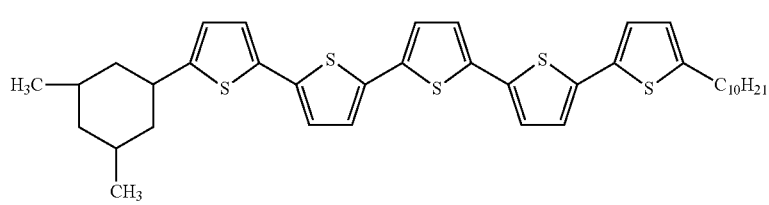
[24]
[chemical formula 5]
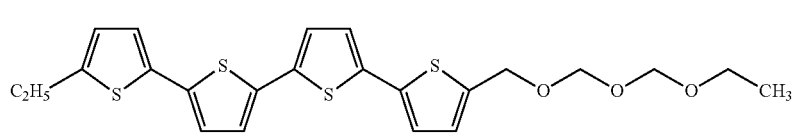
[25]
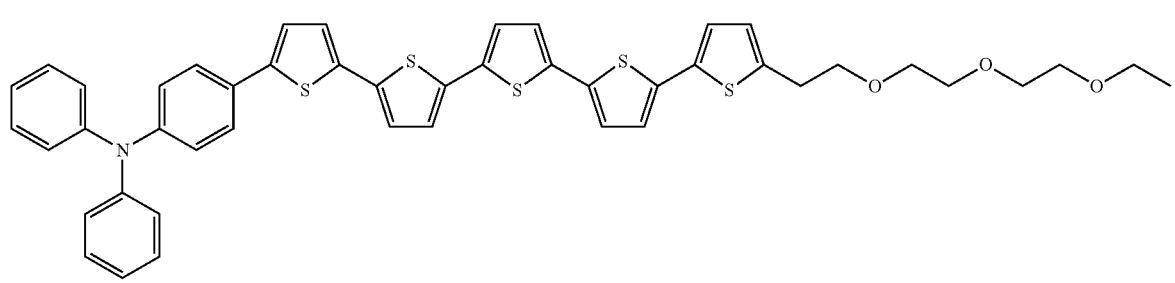
[26]
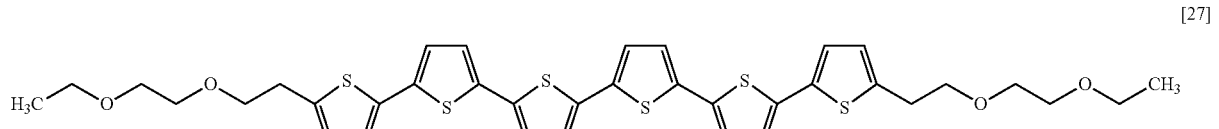
[27]
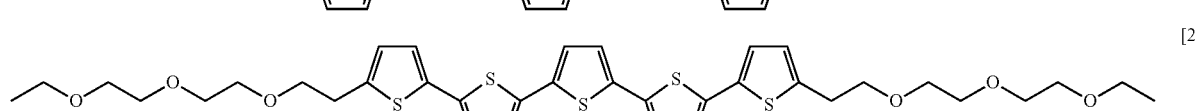
[28]
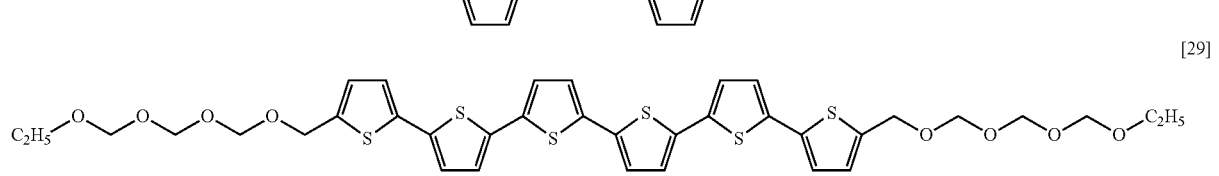
[29]

-continued
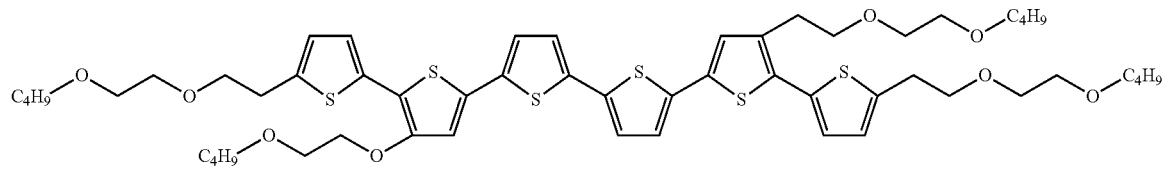
[30]
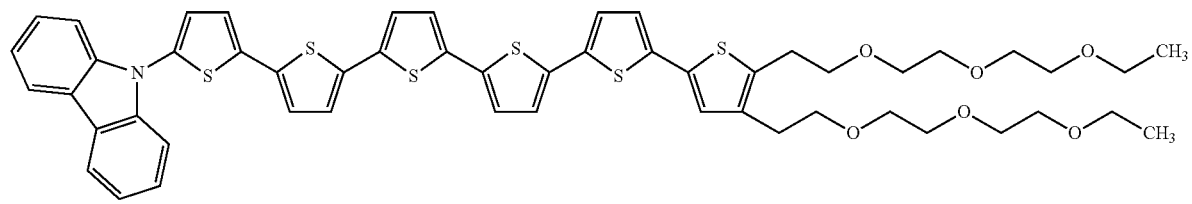
[31]
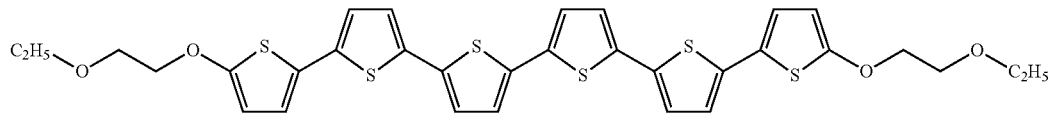
[32]
[chemical formula 6]
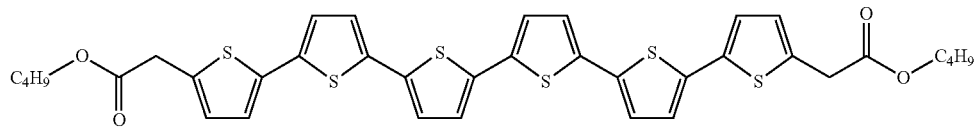
[33]
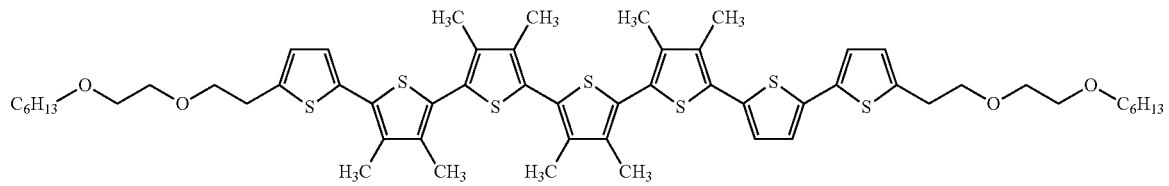
[34]
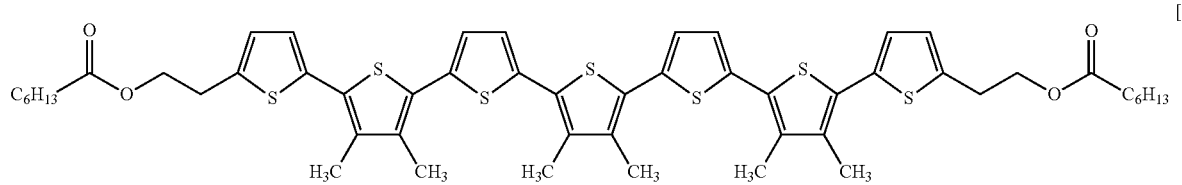
[35]
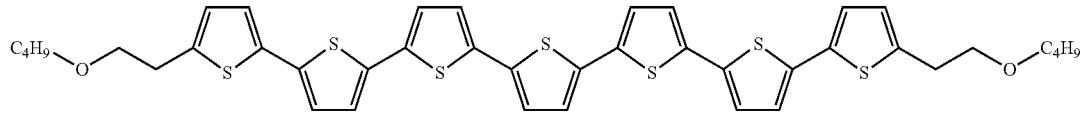
[36]
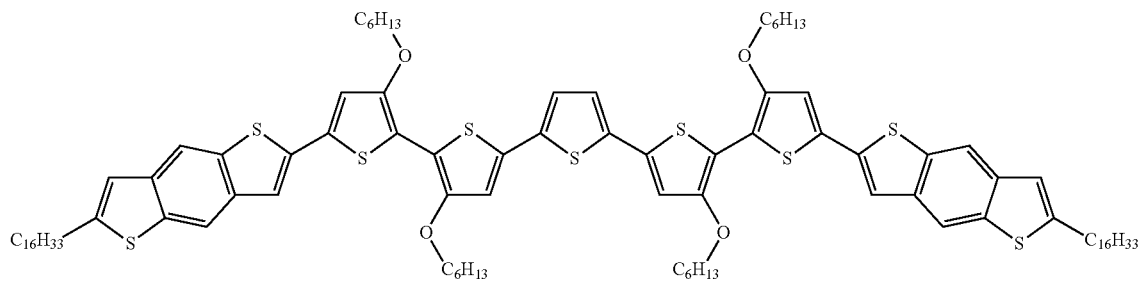
[37]

[38]
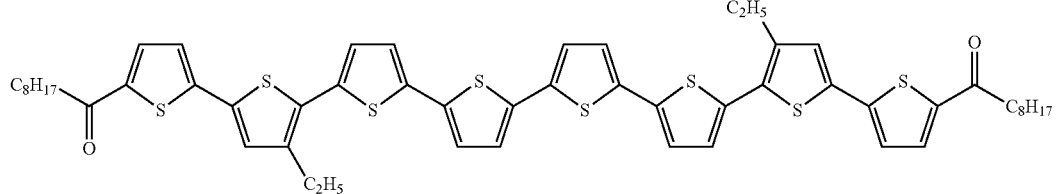
[39]
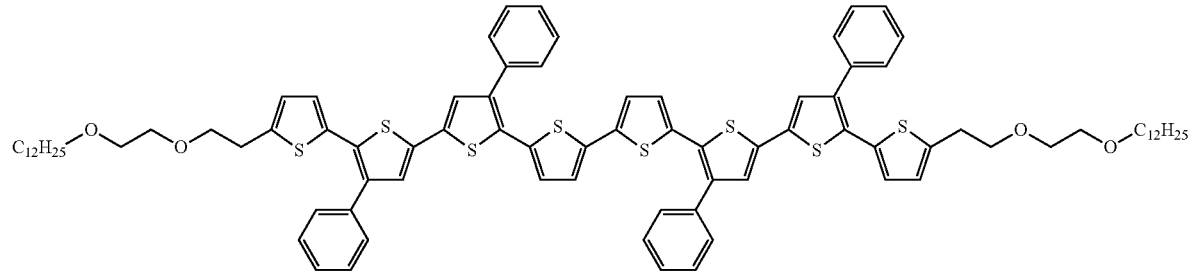
[chemical formula 7]
[40]
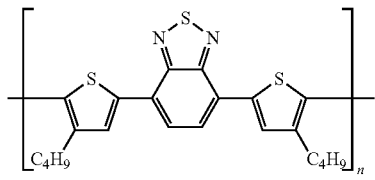
[41]
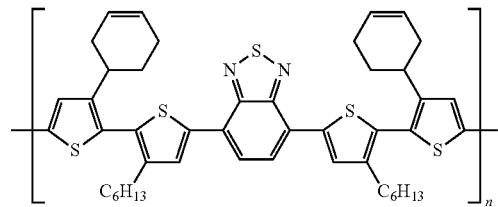
[42]
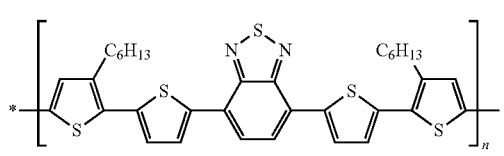
[43]
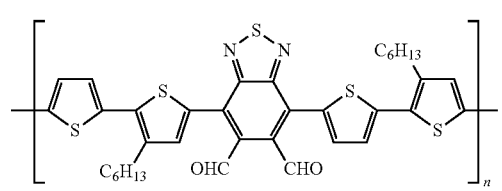
[44]
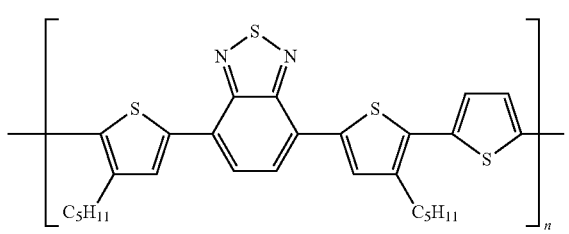
[45]
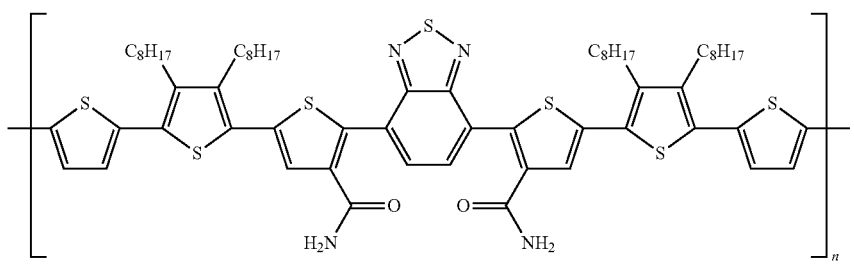

-continued
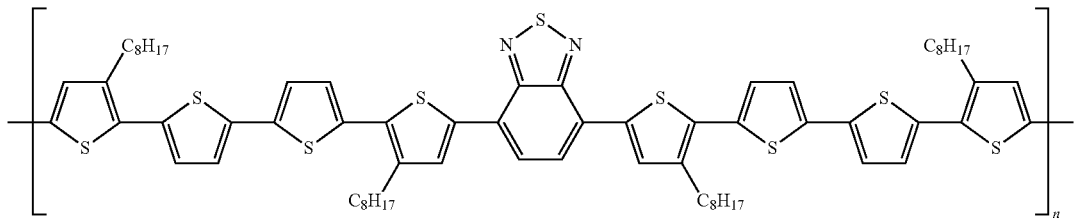
[46]
[chemical formula 8]
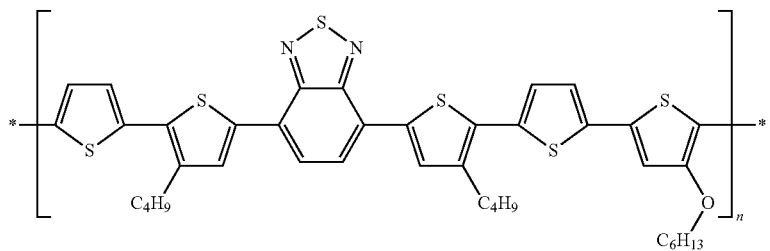
[47]
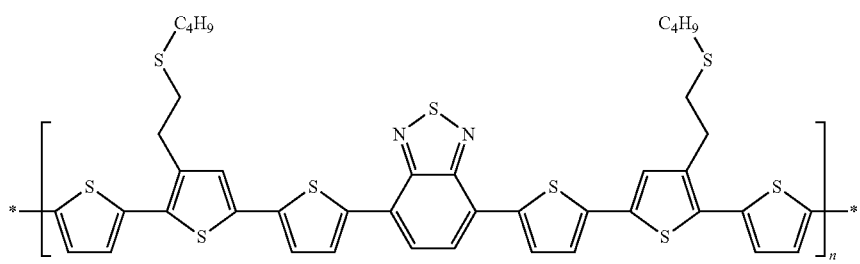
[48]
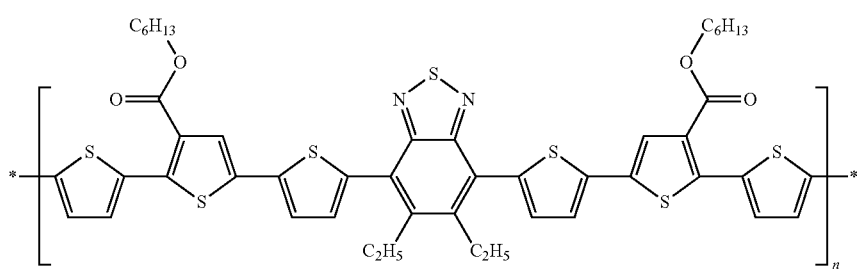
[49]
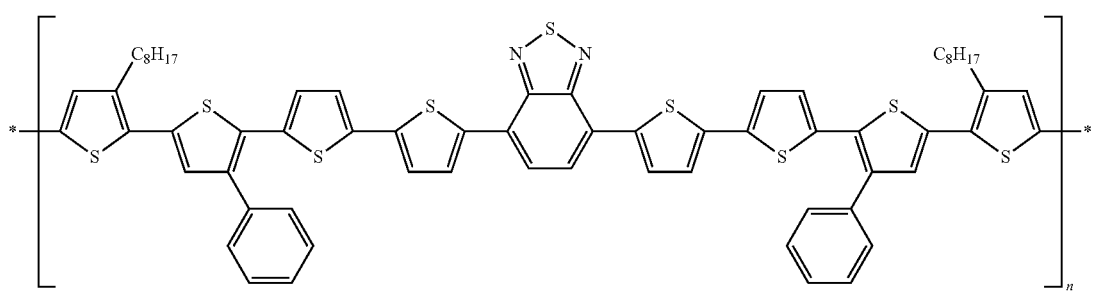
[50]

-continued
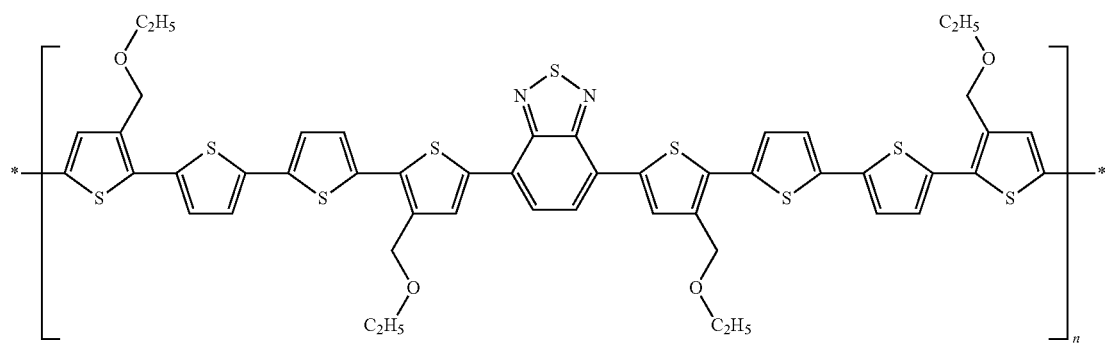
[51]
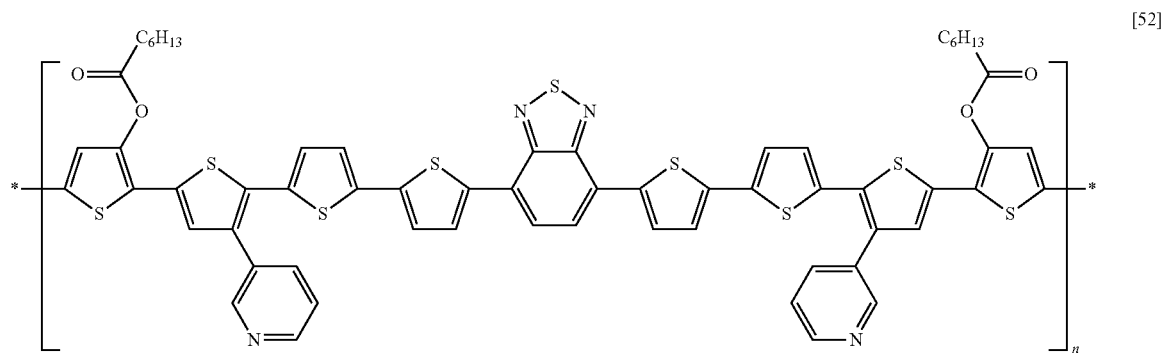
[52]
[chemical formula 9]
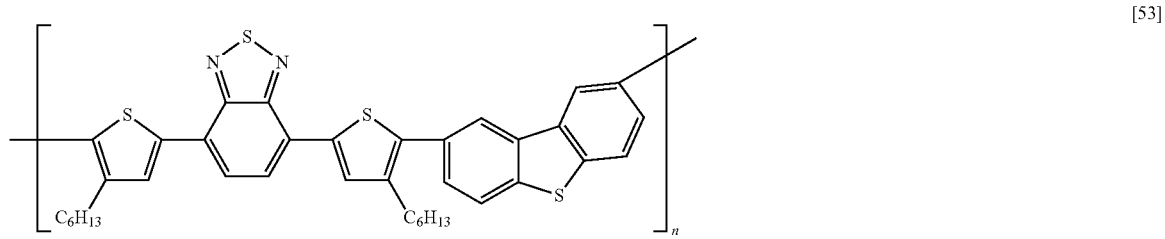
[53]
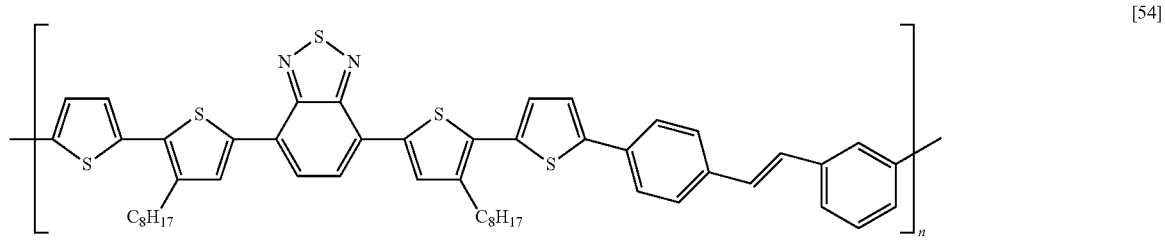
[54]
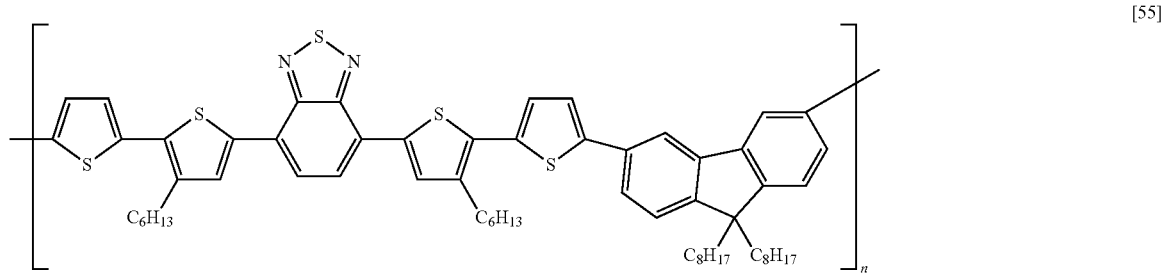
[55]

-continued
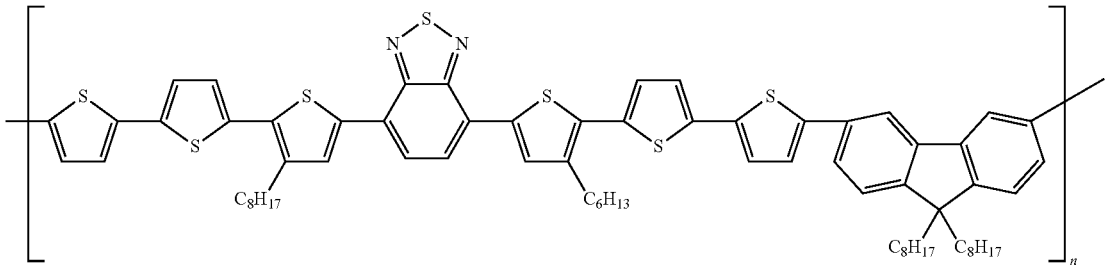
[56]
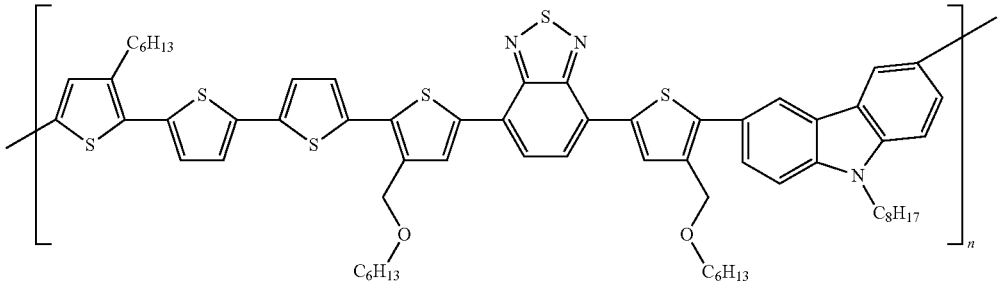
[57]
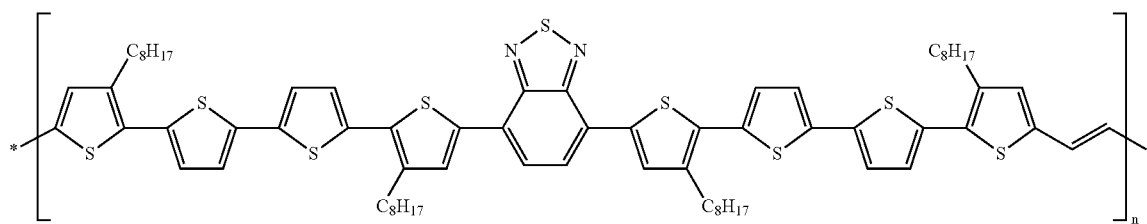
[58]
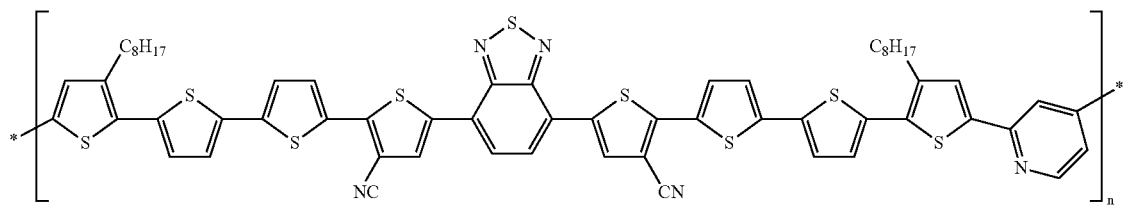
[59]
[chemical formula 10]
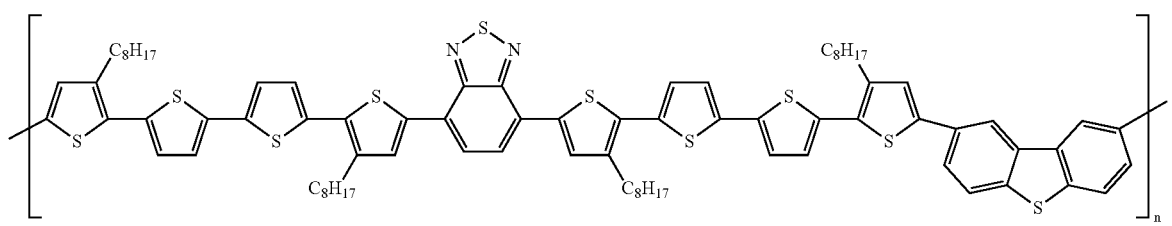
[60]
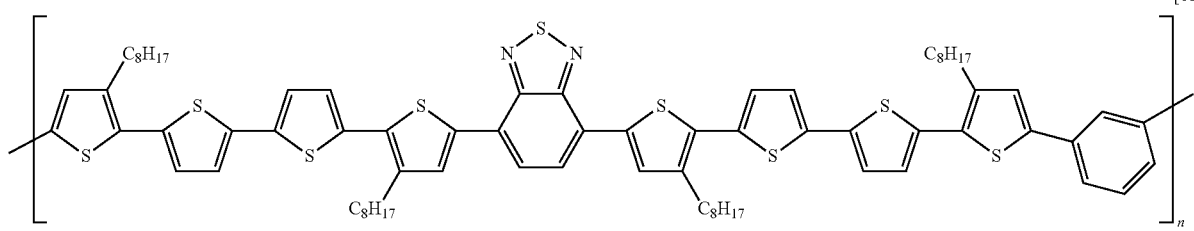
[61]

-continued
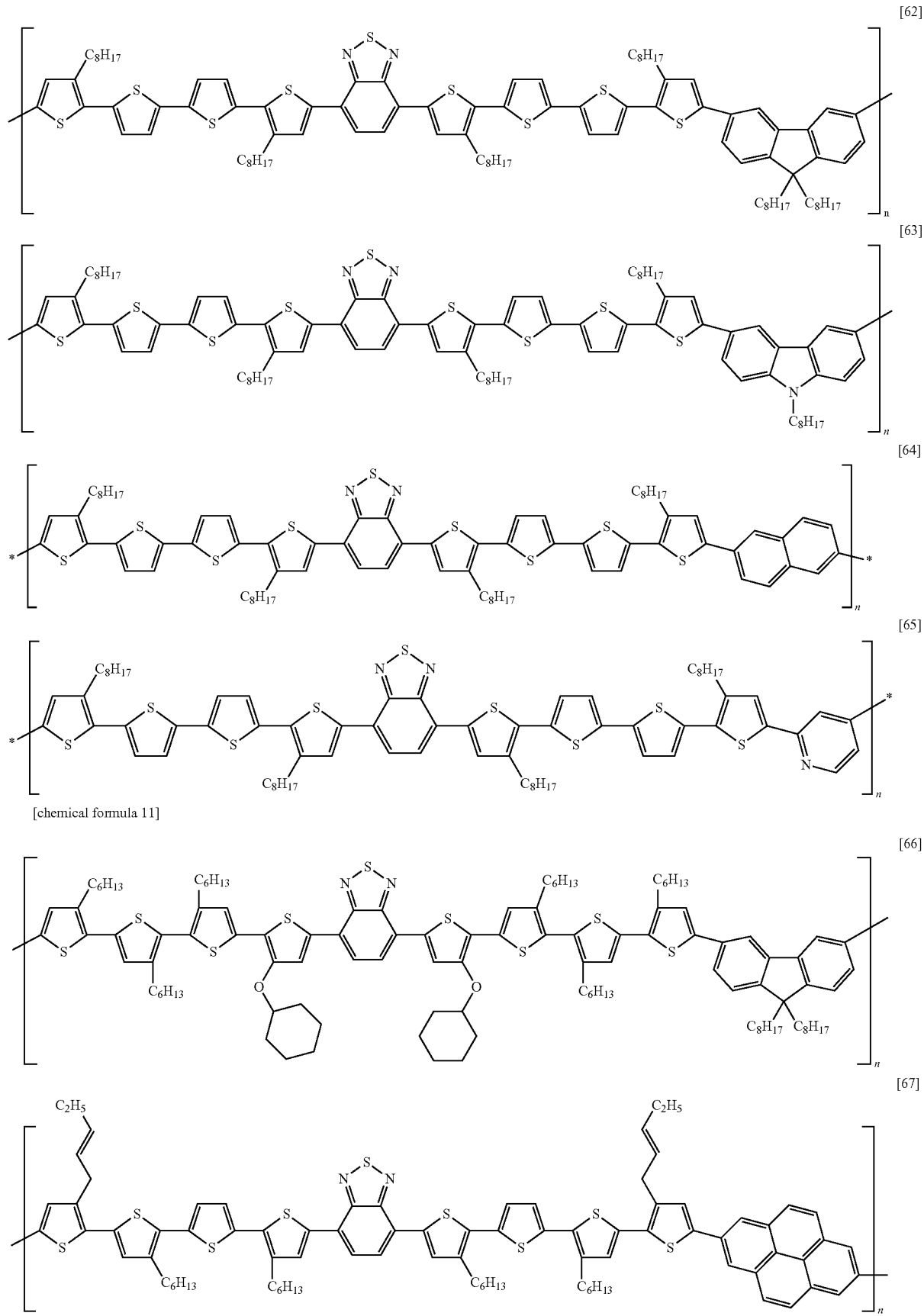
[chemical formula 11]

[68]
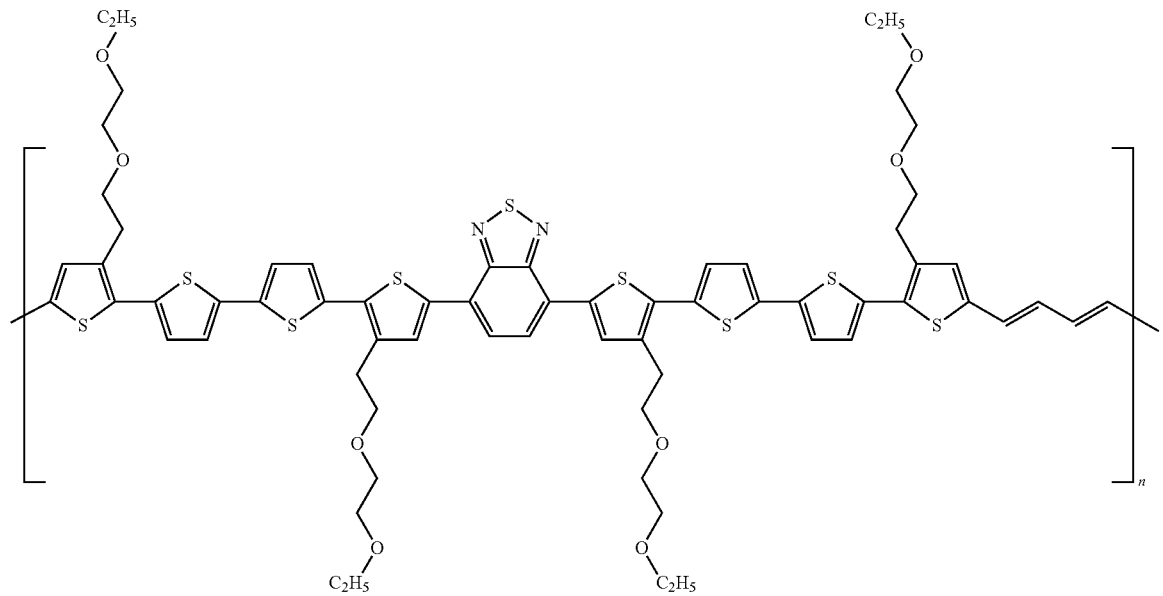
[69]
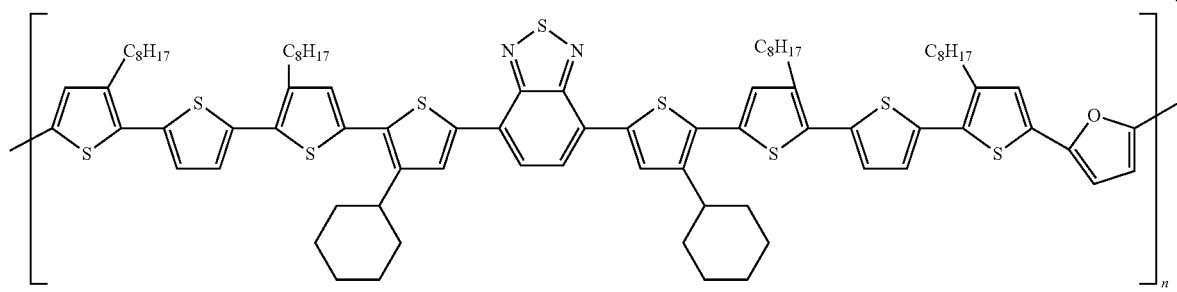
[70]
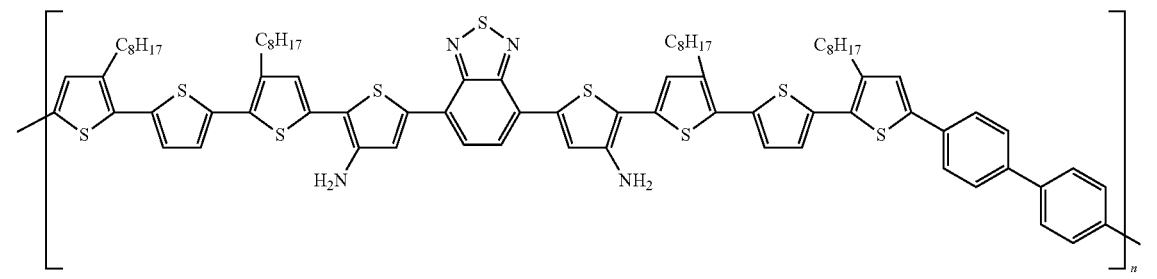
[71]
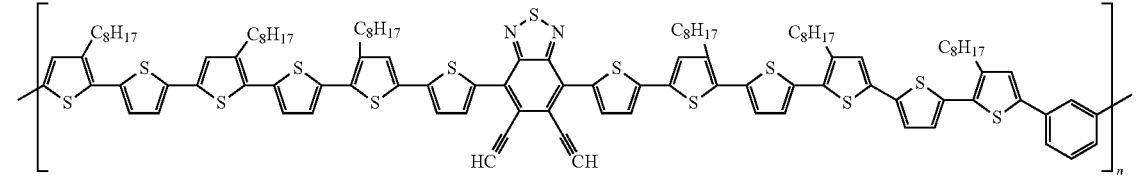
[chemical formula 12]
[72]
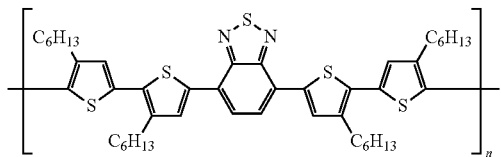
[73]
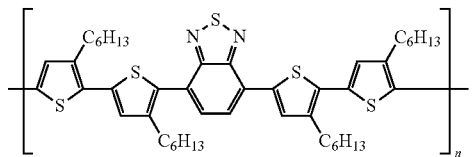

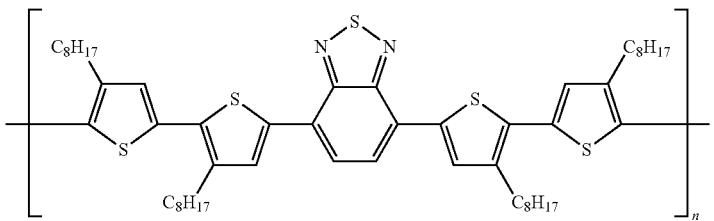

[74]

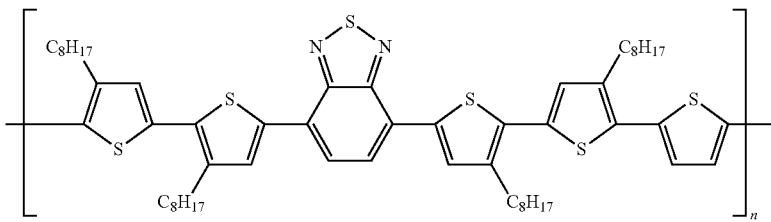

[75]

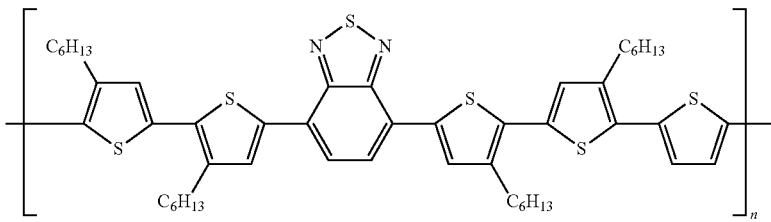

[76]

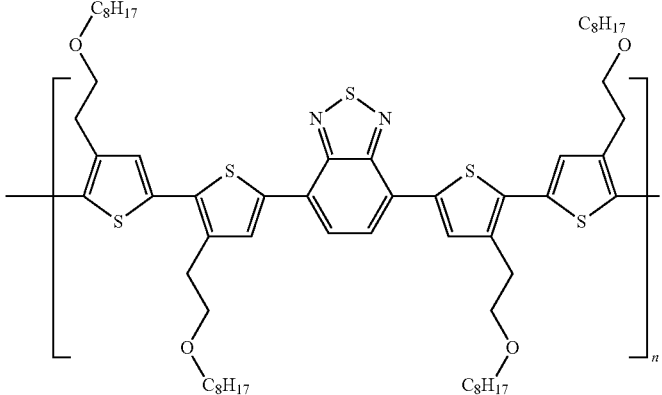

[77]

The conjugated polymer can be synthesized by a known method. For example, as the method for linking thiophene molecules to each other, the following methods can be mentioned: a method in which a halogenated thiophene molecule and thiopheneboronic acid or a thiopheneboronic acid ester is coupled to each other in the presence of a palladium catalyst; and a method in which a halogenated thiophene molecule and a thiophene Grignard reagent are coupled to each other in the presence of a nickel or palladium catalyst. In the case where another unit is linked to a thiophene unit, the above-mentioned another unit is halogenated and then the halogenated unit can be coupled to a thiophene unit in the same manner. Alternatively, the conjugated polymer can also be produced by introducing a polymerizable functional group into a terminal of a monomer produced in the above-mentioned manner and allowing the polymerization of the monomer to proceed in the presence of a palladium catalyst or a nickel catalyst.

It is preferred to remove impurities, including the raw materials used in the synthesis process or by-products, from the conjugated polymer. Examples of the method for removing the impurities include a silica gel column graphy method, a Soxhlet extraction method, a filtration method, an ion exchange method and a chelating method. Two or more of these methods may be employed in combination.

The CNT to be used may be a single-walled CNT having a structure such that a single carbon membrane (a graphene sheet) is wound in a cylindrical form, a two-walled CNT having a structure such that two graphene sheets are wound concentrically, or a multi-walled CNT having a structure such that multiple graphene sheets are wound concentrically. From the viewpoint of achieving high semiconductor properties, a single-walled CNT is preferably used. The CNT can be produced by an arc discharge method, a chemical vapor deposition method (a CVD method), a pulsed-laser deposition method or the like.

It is preferred for the CNTs that semiconducting CNTs are contained in an amount of 80% by mass or more, more preferably 95% by mass or more, relative to the whole amount of the CNTs. As the method for producing CNTs containing semiconducting CNTs in an amount of 80% by mass or more, any known method can be employed. For example, the following methods can be mentioned: a method in which ultracentrifugation is carried out in the co-presence of a density-grading agent; a method in which a specific compound is attached to the surfaces of semiconducting or metallic CNTs selectively and desired CNTs are separated utilizing the difference in solubility; and a method in which desired CNTs are separated by electrophoresis or the like utilizing the difference in an electrical property. Examples of the method for measuring the content of semiconducting CNTs include: a method in which the content is calculated from an absorption area ratio of visible-near-infrared absorption spectra; and a method in which the content is calculated from a ratio of intensities of Raman spectra.

In the case where the CNT composites are used in a semiconductor layer in the rectifying element, it is preferred that the length of each of the CNT is shorter than the distance between the first electrode 2 and the second electrode 3. The average length of the CNTs may vary depending on the distance between the electrode 2 and the electrode 3, and is preferably 2 µm or shorter, more preferably 1 µm or shorter. The average length of the CNTs refers to an average of the lengths of 20 CNTs that are randomly picked up. An example of the method for determining the average length of the CNTs is a method in which 20 CNTs are randomly picked up from an image obtained with an atomic force microscope, a scanning electron microscope, a transmission electron microscope or the like and an average of the lengths of the CNTs is determined. Commercially available CNTs have a dispersion in lengths, and sometimes contain CNTs having longer lengths than the distance between the electrodes. Therefore, it is preferred to provide a step of shortening the lengths of the CNT compared with the distance between the electrode 2 and the electrode 3. For example, a method in which CNTs are cut into shorter fibers by a treatment with an acid, e.g., nitric acid and sulfuric acid, an ultrasonic treatment, a freezing pulverization process or the like is effective. Alternatively, it is also preferred to provide a step of dispersing CNTs in a solvent uniformly and filtering the resultant dispersion through a filter. It becomes possible to efficiently obtain shorter CNTs than the distance between the pair of electrodes by obtaining shorter CNTs than the pore size of the filter from a filtrate. In this case, a membrane filter is preferably used as the filter. The pore size of the filter to be used for the filtration is preferably 0.5 to 10 µm. The combination use of the separation through a filter is more preferred from the viewpoint of the improvement in purity of the CNTs. Other examples of the method for shortening the CNTs include an acid treatment and a freezing pulverization treatment.

The diameter of the CNT is not particularly limited, and is preferably 1 to 100 nm inclusive, more preferably 50 nm or shorter.

(Semiconductor Layer)

The semiconductor layer 4 contains the CNT composites. The semiconductor layer 4 may additionally contain an organic semiconductor material or an insulating material, as long as the electrical properties of the CNT composites cannot be interfered. It is preferred that the total length of the CNT composites that are present per 1 $\mu m^2$ of the semiconductor layer 4 is 10 to 50 µm. The total length falling within this range is preferred, because the rectifying properties of the rectifying element can be improved and the forward resistance of the rectifying element can be reduced. The term "total length of the CNT composites that are present per 1 $\mu m^2$ of the semiconductor layer 4" refers to the sum total of the lengths of the CNT composites that are present in an arbitrarily selected 1-$\mu m^2$ area in the semiconductor layer 4. An example of the method for determining the total length of the CNT composites is a method in which a 1-$\mu m^2$ area is arbitrarily selected from an image of the semiconductor layer which is obtained with an atomic force microscope, a scanning electron microscope, a transmission electron microscope or the like, the lengths of all of the CNT composites contained in the area are measured, and the lengths are summed.

The thickness of the semiconductor layer 4 is preferably 1 to 100 nm inclusive. When the thickness falls within this range, it becomes possible to form a uniform thin film easily. The thickness is more preferably 1 to 50 nm inclusive, still more preferably 1 to 20 nm inclusive. The thickness can be measured with an atomic force microscope or by an ellipsometric method or the like.

As the method for forming the semiconductor layer 4, a dry-mode method, such as resistive thermal evaporation, electron beam, sputtering and CVD may be employed. From the viewpoint of the cost of production and the applicability to large areas, a coating method is preferably employed. Specifically, the coating method is a method in which a composition containing CNT composites, i.e., carbon nanotube composites in each of which a conjugated polymer is adhered onto at least a part of the surface of a carbon nanotube, is applied onto a base by a spin coating method, a blade coating method, a slit die coating method, a screen printing method, a bar coater method, a template method, a print transfer method, a dipping-withdrawing method, an ink jet method or the like to form the semiconductor layer 4. The method for the application may be selected appropriately depending on the desired coating film properties, such as controlled coating thickness and controlled orientation. The base may have a structure such that the pair of electrodes 2 and 3 are provided on the insulating base 1, or a structure such that the third electrode 6, the insulating layer 5 and the pair of electrodes 2 and 3 are provided on the insulating base 1.

In this case, examples of the solvent used in the composition containing CNT composites include tetrahydrofuran, toluene, o-methoxytoluene, m-methoxytoluene, p-methoxytoluene, xylene, 1,2,3-trimethylbenzene, 1,2,3,5-tetramethylbenzene, 1,3-diethylbenzene, 1,4-diethylbenzene, 1,3,5-triethylbenzene, 1,3-diisopropylbenzene, 1,4-isopropylbenzene, 1,4 dipropylbenzene, butylbenzene, isobutylbenzene, 1,3,5-triisopropylbenzene, benzyl alcohol, limonene, isophorone, carboxylic acid, anisole, N-methyl-2-pyrrolidone, dichloromethane, dichloroethane, chloroform, chlorobenzene, dichlorobenzene, o-chlorotoluene, 1,2-dihydronaphthalene, 1,2,3,4-tetrahydronaphthalene, methyl benzoate, ethyl benzoate, ethyl 2,4,6-trimethylbenzoate, ethyl 2-ethoxybenzoate, benzoic acid propyl, o-toluidine, m-toluidine, and p-toluidine. Two or more of these solvents may be used in combination. The coating film may be annealed under the atmosphere, under a reduced pressure or under an inert gas atmosphere (e.g., a nitrogen or argon atmosphere).

It is possible to form a second insulating layer on a side of the semiconductor layer which is opposed to the insulating layer (c). When the second insulating layer is formed, the semiconductor layer can be protected from external environments including oxygen and moisture.

The material to be used for the second insulating layer is not particularly limited, and specific examples of the material include: an inorganic material such as silicon oxide and alumina; an organic high-molecular-weight material such as polyimide or a derivative thereof, poly(vinyl alcohol), poly (vinyl chloride), poly(ethylene terephthalate), poly(vinylidene fluoride), polysiloxane or a derivative thereof, and polyvinylphenol or a derivative thereof; and a mixture of an inorganic material powder and an organic high-molecular-weight material, a mixture of an organic low-molecular-weight material and an organic high-molecular-weight material. Among these materials, an organic high-molecular-weight material is preferably used, because this material can be used in the production by a coating method. From the viewpoint of the uniformity of the insulating layer, it is particularly preferred to use an organic high-molecular-weight material selected from the group consisting of poly (fluoro ethylene), polynorbornene, polysiloxane, polyimide, polystyrene, polycarbonate and derivatives of these compounds, a polyacrylic acid derivative, a polymethacrylic acid derivative, and a copolymer each containing any one of these compounds. An organic high-molecular-weight material selected from the group consisting of polysiloxane, polystyrene, polyvinylphenol and poly(methyl methacrylate) is particularly preferred, because it becomes possible to protect the semiconductor layer without increasing the electrical resistance of the semiconductor layer, i.e., the forward resistance of the rectifying element.

The thickness of the second insulating layer is preferably 50 nm to 10 µm, more preferably 100 nm to 3 µm. The second insulating layer may be composed of a single layer or multiple layers. Alternatively, the second insulating layer may be composed of a single layer made from multiple insulating materials, or may be composed of a laminate formed by laminating multiple insulating materials.

The method for forming the second insulating layer is not particularly limited, and a dry-mode method, such as resistive thermal evaporation, electron beam, sputtering and CVD, may also be employed. From the viewpoint of the cost of production and the applicability to larger areas, a coating method is preferably employed. Specifically, as the coating method, a spin coating method, a blade coating method, a slit die coating method, a screen printing method, a bar coater method, a template method, a print transfer method, a dipping-withdrawing method, an ink jet method, a drop cast method and the like can be employed preferably. The method for the application may be selected appropriately depending on the desired coating film properties, such as controlled coating thickness and controlled orientation.

When the second insulating layer is formed by application method, examples of a solvent for dissolving the insulating material used in the second insulating layer include, but are not particularly limited to, ethers such as ethylene glycol monomethyl ether, ethylene glycol monoethyl ether, propylene glycol monomethyl ether, propylene glycol monoethyl ether, propylene glycol mono n-butyl ether, propylene glycol mono t-butyl ether, ethylene glycol dimethyl ether, ethylene glycol diethyl ether, ethylene glycol dibutyl ether, and diethylene glycol ethyl methyl ether; esters such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, ethyl lactate, and butyl lactate; ketones such as acetone, methyl ethyl ketone, methyl propyl ketone, methyl butyl ketone, methyl isobutyl ketone, cyclopentanone, and 2-heptanone; alcohols such as butyl alcohol, isobutyl alcohol, pentanol, 4-methyl-2-pentanol, 3-methyl-2-butanol, 3-methyl-3-methoxybutanol, and diacetone alcohol; aromatic hydrocarbons such as toluene and xylene. Two or more of these solvents may be used in combination.

Among these solvents, a solvent having a boiling point at 1 atm of 110 to 200° C. is preferably contained. When the boiling point is 110° C. or higher, the evaporation of the solvent during the application of the solution can be prevented and good coatability can be achieved. When the boiling point is 200° C. or lower, the amount of the solvent remaining in the insulating film is reduced and it becomes possible to form an insulating layer having better heat resistance and chemical resistance. The formed coating film may be annealed under the atmosphere, under a reduced pressure or under an inert gas atmosphere (e.g., a nitrogen or argon atmosphere).

Figure 4:
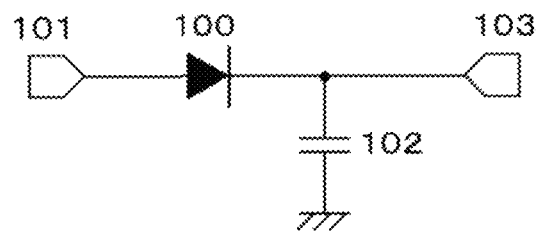
FIG. 4 shows a block circuit diagram illustrating one example of a rectifier circuit using a rectifying element.

One example of a rectifier circuit produced using the rectifying element thus formed is shown in FIG. 4. The rectifier circuit shown in FIG. 4 is a half-wave rectifier circuit equipped with a rectifying element 100, an input terminal 101 into which an alternating current is input, a capacitor 102 and an output terminal 103, wherein only a half cycle of an alternating current is rectified. The input terminal 101 and one of electrodes in the rectifying element 100 are electrically connected to each other, and the output terminal 103, the other of the electrodes in the rectifying element 100 and one of electrodes in the capacitor 102 are electrically connected to one another. The other of the electrodes in the capacitor 102 is electrically connected to an earth potential.

The properties of the rectifying element can be determined by, for example, inputting an alternating current into the rectifier circuit and measuring a direct current output from the rectifier circuit. A rectifying element from which a maximum direct-current output voltage relative to an alternating-current input voltage is determined as being a rectifying element having less power loss and therefore having superior properties.

<Wireless Communication Device>

Next, a wireless communication device equipped with the rectifying element according to an embodiment of the present invention will be described. The wireless communication device is a device such as a RFID in which electrical communication is performed by receiving a carrier wave sent from an antenna mounted on an outside reader/writer by a RFID tag.

Specific operations are as follows. A radio signal sent from, for example, an antenna installed in a reader/writer is received by an antenna installed in a RFID tag to generate an induced current in the antenna, the induced current is converted into a direct current through the rectifier circuit to generate an electric power, and the RFID tag is activated by the electric power. Subsequently, the activated RFID tag receives a command from the radio signal and performs an action corresponding to the command. Subsequently, the answer of the result corresponding to the command is sent from the antenna on the RFID tag to the antenna on the reader/writer as a radio signal. The action corresponding to the command can be performed through a known demodulator circuit, a known action control logic circuit, a modulator circuit or the like.

Figure 5:
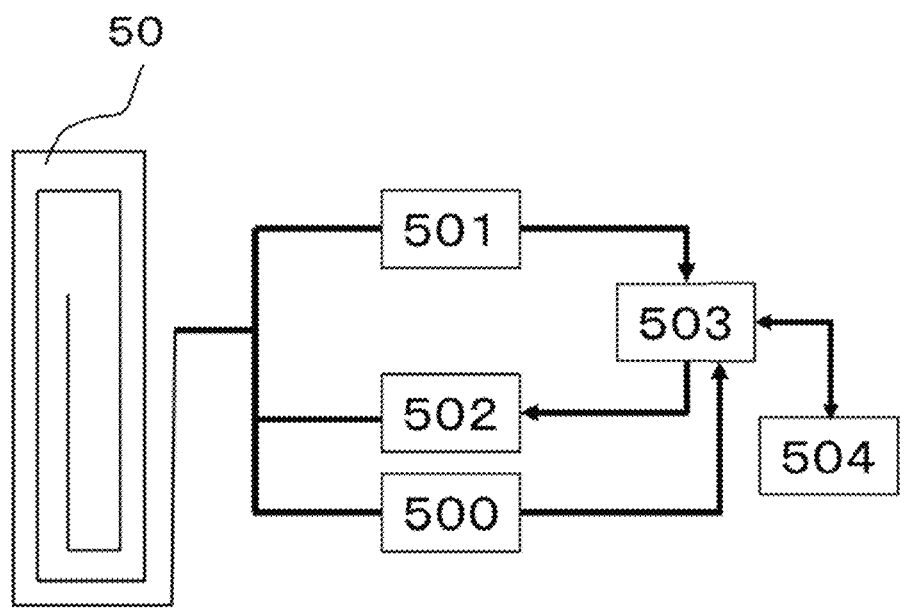
FIG. 5 shows a block diagram illustrating one example of a wireless communication device using a rectifying element of the present invention.

The wireless communication device according to an embodiment of the present invention is equipped with at least the above-mentioned rectifying element and an antenna. More specifically, as illustrated in the block diagram in FIG. 5, the wireless communication device is composed of: a rectifier circuit 500 in which an external modulated wave signal received by an antenna 50 is rectified to supply a power source to each unit; a demodulator circuit 501 in which the modulated wave signal received by the antenna 50 is demodulated and is sent to a controller circuit;

a memory circuit 504 in which data is stored; a controller circuit 503 in which the writing of the data demodulated in the demodulator circuit on the memory circuit, the reading of the data from the memory circuit and the sending of the data to the modulator circuit are performed; and a modulator circuit 502 in which the data sent from the controller circuit is modulated and is sent to the antenna. An example of the wireless communication device is one in which the electronic circuits are electrically connected to one another.

The rectifier circuit is composed of at least the rectifying element and the capacitor, and may be optionally equipped with a transistor, a resistive element and the like. Each of the demodulator circuit, the controller circuit, the modulator circuit and the memory circuit is composed of a transistor, a capacitor, a resistive element, a diode and the like. The memory circuit is additionally equipped with a non-volatile rewritable memory unit such as an EEPROM (Electrically Erasable Programmable Read-Only Memory) and a FeRAM (Ferroelectric Random Access Memory).

The antenna, the transistor, the capacitor, the resistive element, the diode, the non-volatile rewritable memory unit and the like may be conventional ones, and the materials and shapes thereof are not particularly limited. A material to be used for electrically connecting these components may be any conventional conductive material. The method for the connection may be any one, as long as electrical conduction can be performed. The widths and thicknesses of connecting parts can be arbitrarily selected.

<Commodity Tag>

Next, a commodity tag provided with the wireless communication device according to an embodiment of the present invention will be described. The commodity tag is equipped with, for example, a base and the wireless communication device covered with the base.

The base is formed from, for example, a non-metallic material such as a sheet of flat paper or a flat plastic material. The material that forms the base is not particularly limited, as long as a radio wave can penetrate through the material. A specific example of the base is a laminate in which two sheets of flat paper are bonded together. The wireless communication device is sandwiched between the two sheets of paper. Individual identification information for individual-identifying a commodity or the like is pre-stored in the memory circuit in the wireless memory device.

Wireless communication is performed between the commodity tag and the reader/writer. The reader/writer is a device for reading and writing data corresponding to the commodity tag by radio, and performs the exchange of data with the commodity tag during the process of distribution of a commodity or upon the payment of a commodity. For example, the reader/writer may be of a portable type or a fixed type that can be set at a cash resistor. The reader/writer to be used may be any conventional one.

Specifically, the commodity tag has an identification information reply function for returning the individual identification information stored therein by radio in response to a desired command that comes from the reader/writer and requires the sending of the individual identification information. Due to this function, it becomes possible to identify many commodities simultaneously and in a contactless manner at a commodity check-out resistor, and it also becomes possible to make a payment processing easier and more rapid compared with that in bar code identification.

For example, in the accounting of a commodity, it becomes possible that the reader/writer sends commodity information, which is read from the commodity tag, to a POS (Point of sale system, information management at point of sales) terminal and the selling of a commodity specified by the commodity information is registered in the POS terminal.

EXAMPLES

Hereinbelow, the present invention will be described more specifically with reference to examples. However, the invention is not limited to the examples. The evaluation methods employed in the examples are described in the following items (1) to (3).

(1) Measurement of Weight Average Molecular Weight

The weight average molecular weight of a polymer was determined in the following manner. A sample solution was filtered through a membrane filter having a pore diameter of 0.45 µm, and then subjected to a measurement by GPC (GEL PERMEATION CHROMATOGRAPHY: gel permeation chromatography, HLC-8220GPC, manufactured by Tosoh Corporation) (developing solvent: tetrahydrofuran, developing speed: 0.4 ml/min.). The resultant value was compared with a value of a polystyrene standard sample to determine the weight average molecular weight in terms of polystyrene.

(2) Evaluation of Adhesion of Electrode

Figure 6:
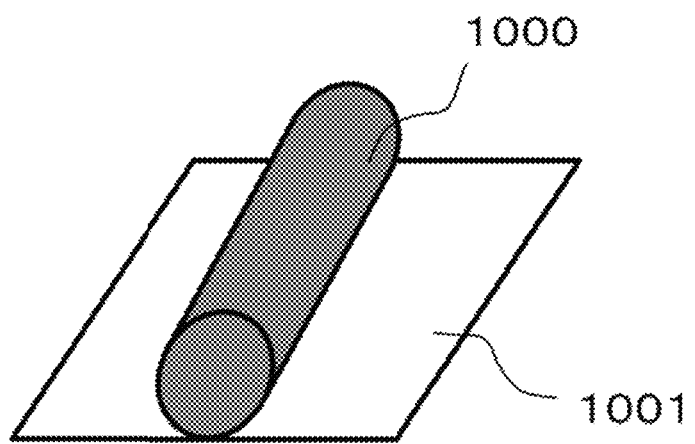
FIG. 6 shows a schematic perspective view for the evaluation of adhesion resistance of an electrode at bending.
Figure 7:
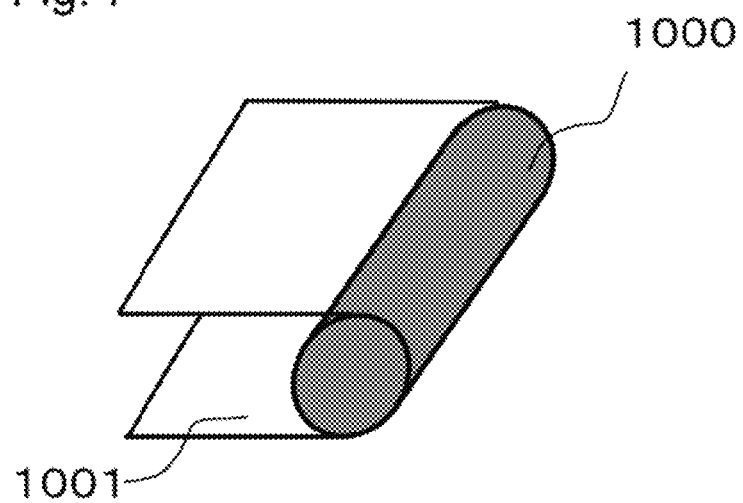
FIG. 7 shows a schematic perspective view for the evaluation of adhesion resistance of an electrode at bending.

The evaluation will be described with reference to FIGS. 6 and 7. A metallic cylinder 1000 having a diameter of 30 mm was fixed at the center of a complementary semiconductor device-formed surface of a substrate 1001 having the complementary semiconductor device formed thereon, then the substrate was placed along the cylinder in such a manner that the winding angle around the cylinder became 0° (i.e., a state where the sample became flat) (see FIG. 6), and then the substrate was bent until the winding angle around the cylinder became 180° (i.e., a state where the substrate was folded back at the cylinder) (see FIG. 7). With respect to the bending resistance, the pattern of the complementary semiconductor device was observed with an optical microscope before and after the bending action to confirm the presence or absence of delamination or cracking.

(3) Method for Measuring Total Length of CNT Composites

An arbitrarily selected 1-µm$^2$ area in a semiconductor layer 4 was observed with a transmission electron microscope at a magnification of ×1,500,000, and the lengths of all of CNT composites contained in the area were measured to determine the total length of the CNT composites.

Synthetic Example 1; Compound P1 (Binder)

Copolymerization ratio (by mass): ethyl acrylate (also referred to as "EA", hereinafter)/2-ethylhexyl methacrylate (also referred to as "2-EHMA", hereinafter)/styrene (also referred to as "St", hereinafter)/glycidyl methacrylate (also referred to as "GMA", hereinafter)/acrylic acid (also referred to as "AA", hereinafter)=20/40/20/5/15.

Diethylene glycol monoethyl ether acetate (also referred to as "DMEA", hereinafter) (150 g) was charged in a reaction vessel in a nitrogen atmosphere, and the reaction vessel was heated to 80° C. using an oil bath. To the oil bath was dropwisely added a mixture of EA (20 g), 2-EHMA (40 g), St (20 g), AA (15 g), 2,2'-azobisisobutyronitrile (0.8 g) and DMEA (10 g) over 1 hour. After the completion of the dropwise addition, the polymerization reaction was carried out for additional 6 hours. Subsequently, hydroquinone monomethyl ether (1 g) was added to the resultant solution to terminate the polymerization reaction. Subsequently, a mixture of GMA (5 g), triethylbenzylammonium chloride (1 g) and DMEA (10 g) was dropwisely added over 0.5 hour.

After the completion of the dropwise addition, the addition reaction was carried out for additional 2 hours. The resultant reaction solution was purified with methanol to remove unreacted impurities, and then the resultant product was dried under vacuum for 24 hours to produce a compound P1.

Synthetic Example 2; Compound P2 (Binder)

Copolymerization ratio (by mass): a bifunctional epoxy acrylate monomer (epoxy ester 3002A; manufactured by Kyoeisha Chemical Co., Ltd.)/a bifunctional epoxy acrylate monomer (epoxy ester 70PA; manufactured by Kyoeisha Chemical Co., Ltd.)/GMA/St/AA=20/40/5/20/15.

Diethylene glycol monoethyl ether acetate (also referred to as "DMEA", hereinafter) (150 g) was charged in a reaction vessel in a nitrogen atmosphere, and the reaction vessel was heated to 80° C. using an oil bath. To the oil bath was dropwisely added a mixture of an epoxy ester 3002A (20 g), an epoxy ester 70PA (40 g), St (20 g), AA (15 g), 2,2'-azobisisobutyronitrile (0.8 g) and DMEA (10 g) over 1 hour. After the completion of the dropwise addition, the polymerization reaction was carried out for additional 6 hours. Subsequently, hydroquinone monomethyl ether (1 g) was added to the resultant solution to terminate the polymerization reaction. Subsequently, a mixture of GMA (5 g), triethylbenzylammonium chloride (1 g) and DMEA (10 g) was dropwisely added over 0.5 hour. After the completion of the dropwise addition, the addition reaction was carried out for additional 2 hours. The resultant reaction solution was purified with methanol to remove unreacted impurities, and then the resultant product was dried under vacuum for 24 hours to produce a compound P2.

Synthetic Example 3; Compound P3 (Binder)

Urethane-Modified Compound of Compound P2

Diethylene glycol monoethyl ether acetate (also referred to as "DMEA", hereinafter) (100 g) was charged in a reaction vessel in a nitrogen atmosphere, and the reaction vessel was heated to 80° C. using an oil bath. To the oil bath was dropwisely added a mixture of the photosensitive component P2 (10 g), n-hexyl isocyanate (3.5 g) and DMEA (10 g) over 1 hour. After the completion of the dropwise addition, the reaction was carried out for additional 3 hours. The resultant reaction solution was purified with methanol to remove unreacted impurities, and then the resultant product was dried under vacuum for 24 hours to produce a compound P3 which had a urethane bond.

Preparation Example 1; Conductive Paste A

Into a 100-ml clean bottle were charged the compound P1 produced in the above procedure (16 g), the compound P3 (4 g), a photopolymerization initiator OXE-01 (manufactured by BASF Japan Ltd.) (4 g), an acid generator SI-110 (manufactured by Sanshin Chemical Industry Co., Ltd.) (0.6 g) and γ-butyrolactone (manufactured by Mitsubishi Gas Chemical Company, Inc.) (10 g). These components were mixed together with a planetary centrifugal vacuum mixer "Awatori Rentarou" (a registered trademark) (ARE-310; manufactured by Thinky Corporation) to produce a photosensitive resin solution (46.6 g) (solid content: 78.5% by mass). The photosensitive resin solution (8.0 g) was mixed with Ag particles having an average particle diameter of 0.2 μm (42.0 g), and the resultant mixture was kneaded with a three-roll roller "EXAKT M-50" (a product name, manufactured by EXAKT) to produce a conductive paste A (50 g).

Example 1

(1) Production of Semiconductor Solution

CNTs 1 (manufactured by CNI, single-layer CNTs, purity: 95%) (1.0 mg) were added to a solution of poly(3-hexylthiophene) (P3HT) (manufactured by Aldrich) (2.0 mg) in chloroform (10 ml), and the solution was stirred ultrasonically using an ultrasonic homogenizer (VCX-500, manufactured by Tokyo Rikakikai Co., Ltd.) at an output of 20% for 4 hours while ice-cooling to produce a CNT composite dispersion A (the concentration of the CNT composites in the solvent: 0.96 g/l).

Subsequently, a semiconductor solution for forming a semiconductor layer was produced. The CNT composite dispersion A was filtered through a membrane filter (pore diameter: 10 μm, diameter: 25 mm, Omnipore membrane manufactured by Millipore) to remove the CNT composites each having a length of 10 μm or longer. o-DCB (manufactured by Wako Pure Chemical Industries Ltd.) (5 ml) was added to the filtrate, and then chloroform, which was a low-boiling-point solvent, was distilled away using a rotary evaporator to replace the solvent by o-DCB, thereby producing a CNT composite dispersion B. o-DCB (3 mL) was added to the CNT composite dispersion B (1 ml) to produce a semiconductor solution A (concentration of the CNT composites in the solvent: 0.03 g/l).

(2) Production of Rectifying Element

A rectifying element as illustrated in FIG. 1 was produced. Chromium and gold were deposited under vacuum at thicknesses of 5 nm and 50 nm, respectively, on a glass substrate 1 (thickness: 0.7 mm) through a mask by a resistance heating method to form a first electrode 2. Subsequently, aluminum was also deposited under vacuum at a thickness of 50 nm through a mask by a resistance heating method in the same manner as mentioned above to form a second electrode 3.

Each of the pair of electrodes, i.e., the electrodes 2 and 3, had a width of 100 μm, and the distance between the two electrodes was 10 μm. The semiconductor solution A (400 μl) produced by the method mentioned in item (1) above was dropped on the substrate having electrodes formed thereon using an inkjet device (manufactured by Cluster Technology Co., Ltd.) to form a semiconductor layer 4, and then the semiconductor layer 4 was heated on a hot plate under a nitrogen stream at 150° C. for 30 minutes to produce a rectifying element.

(3) Evaluation of Rectifying Element

Next, the current-voltage properties of the rectifying element were measured. The measurement was carried out by a two-terminal method using a semiconductor property evaluation system model-4200-SCS (manufactured by Keithley Instruments). The measurement was carried out in the atmosphere (temperature: 20° C., humidity: 35%), and it was confirmed that rectifying properties were achieved. The current value that flowed into the rectifying element upon the application of 2 V of voltage was 10 μA.

Example 2

(1) Preparation of Insulating Layer Solution

Methyltrimethoxysilane (61.29 g) (0.45 mole), β-(3,4-epoxycyclohexyl)ethyltrimethoxysilane (12.31 g) (0.05 mole) and phenyltrimethoxysilane (99.15 g) (0.5 mole) were dissolved in propylene glycol monobutyl ether (boiling point: 170° C.) (203.36 g), and then water (54.90 g) and phosphoric acid (0.864 g) were added to the resultant solution while stirring. The resultant solution was heated at a bath temperature of 105° C. for 2 hours to increase the inside temperature to 90° C. to distil away a component mainly composed of methanol that was produced as a by-product. Subsequently, the solution was heated at a bath temperature of 130° C. for 2.0 hours to increase the inside temperature to 118° C. to distil away a component mainly composed of water and propylene glycol monobutyl ether, and then the solution was cooled to room temperature to produce an insulating layer solution A having a solid material concentration of 26.0% by mass.

An aliquot (50 g) of the insulating layer solution A was weighed, and was mixed with propylene glycol monobutyl ether (boiling point: 170° C.) (16.6 g) and then stirred at room temperature for 2 hours to produce an insulating layer solution B (solid material concentration: 19.5% by mass).

(2) Production of Rectifying Element

A rectifying element as illustrated in FIG. 3 was produced. Chromium and gold were deposited under vacuum at thicknesses of 5 nm and 50 nm, respectively, on a glass substrate 1 (thickness: 0.7 mm) through a mask by a resistance heating method to form an electrode 6. Subsequently, the insulating layer solution B produced by the method mentioned in item (1) above was spin-coated (800 rpm×20 seconds) on the glass substrate having the electrode 6 formed thereon, and the resultant product was heated at 120° C. for 5 minutes. The insulating layer solution B was spin-coated (800 rpm×20 seconds) again, and the resultant product was heated at 200° C. for 30 minutes under a nitrogen stream to form an insulating layer 5 having a thickness of 400 nm. Gold was deposited under vacuum at a thickness of 50 nm on the insulating layer 5 by a resistance heating method, then a photoresist (product name: "LC100-10 cP", manufactured by Rohm and Haas Company) was spin-coated (1000 rpm×20 seconds), and then the resultant product was dried by heating at 100° C. for 10 minutes.

The photoresist film thus formed was exposed to light through a mask using a parallel light mask aligner (PLA-501F, manufactured by Cannon Inc.) to form a pattern, was then subjected to shower development for 70 seconds with ELM-D (product name, manufactured by Mitsubishi Gas Chemical Company, Inc.) (a 2.38-mass % aqueous tetramethylammonium hydroxide solution) using an automatic developer (AD-2000, manufactured by Takizawa Co., Ltd.), and was then washed with water for 30 seconds. Subsequently, the resultant product was etched with an etching solution AURUM-302 (a product name; manufactured by Kanto Chemical Co., Inc.) for 5 minutes, and was then washed with water for 30 seconds. The resultant product was immersed in AZ Remover 100 (a product name, manufactured by AZ Electronic Materials) for 5 minutes to remove the resist, was then washed with water for 30 seconds, and was then dried by heating at 120° C. for 20 minutes. In this manner, a first electrode 2 and a second electrode 3 were formed.

Each of the pair of electrodes, i.e., the electrodes 2 and 3, had a width of 1000 μm, and the distance between the two electrodes was 10 μm. A semiconductor layer 4 was formed on the substrate having the electrodes formed thereon in the same manner as in Example 1, and the resultant product was heated on a hot plate under a nitrogen stream at 150° C. for 30 minutes to produce a rectifying element which is the aspect illustrated in FIG. 3. The total length of the CNT composites which were present per 1 μm$^2$ of the semiconductor layer 4 was 20 μm.

(3) Evaluation of Rectifying Element

Next, the current-voltage properties of the rectifying element were measured. The measurement was carried out by a two-terminal method in which the electrode 3 and the electrode 6 were electrically connected to each other through a gold wire and the electrode 2 served as an input electrode and the electrodes 3 and 6 served as output electrodes. The measurement was carried out in the atmosphere (temperature: 20° C., humidity: 35%), and it was confirmed that rectifying properties were achieved.

Next, a rectifier circuit as illustrated in FIG. 4 was constructed using the rectifying element. The capacity value of a capacitor 102 was 300 [pF]. The electrode 2 in the rectifying element was connected to an input terminal 101 in the rectifying element, and the electrode 3 in the rectifying element was connected to the capacitor 102 and an output terminal 103. The electrode located on the opposite side of the capacitor 102 was electrically connected to an earth potential. When an alternating-current voltage (voltage amplitude: 10 [V]) was input to the input terminal 101, the average value of direct-current voltages that were output to the output terminal 103 was 2.5 [V] and the dispersion in the direct-current voltages was 0.8 [V].

Example 3

(1) Production of Rectifying Element

The same procedure as in Example 2 was carried out, except that the semiconductor solution A (50 pl) was dropped to form a semiconductor layer 4. In this manner, a rectifying element was produced. The total length of the CNT composites which were present per 1 μm$^2$ of the semiconductor layer 4 was 5 μm.

(2) Evaluation of Rectifying Element

For the purpose of evaluating the rectifying element produced above, a rectifier circuit was constructed in the same manner as in Example 2. When an alternating-current voltage (voltage amplitude: 10 [V]) was input to the input terminal 101, the average value of direct-current voltages that were output to the output terminal 103 was 1.8 [V] and the dispersion in the direct-current voltages was 0.9 [V].

Example 4

(1) Production of Rectifying Element

The same procedure as in Example 2 was carried out, except that the semiconductor solution A (5000 pl) was dropped to form a semiconductor layer 4. In this manner, a rectifying element was produced. The total length of the CNT composites which were present per 1 µm² of the semiconductor layer 4 was 100 µm.

(2) Evaluation of Rectifying Element

For the purpose of evaluating the rectifying element produced above, a rectifier circuit was constructed in the same manner as in Example 2. When an alternating-current voltage (voltage amplitude: 10 [V]) was input to the input terminal 101, the average value of direct-current voltages that were output to the output terminal 103 was 1.5 [V] and the dispersion in the direct-current voltages was 0.3 [V].

Example 5

(1) Preparation of Insulating Layer Solution

An aliquot (10 g) of the insulating layer solution A was weighted, and aluminum bis(ethylacetylacetate)mono(2,4-pentanedionate) (product name: "Alumichelate D", manufactured by Kawaken Fine Chemicals Co., Ltd., also referred to as "Alumichelate D", hereinafter) (13 g) and propylene glycol monoethyl ether acetate (also referred to as "PGMEA", hereinafter) (42 g) were mixed with the insulating layer solution A. The resultant mixture was stirred at room temperature for 2 hours to produce an insulating layer solution C (solid material concentration: 24% by mass). The content of the polysiloxane in the solution was 20 parts by mass relative to 100 parts by mass of Alumichelate D.

(2) Production of Rectifying Element

The same procedure as in Example 2 was carried out, except that the insulating layer solution C was used in place of the insulating layer solution B. In this manner, a rectifying element was produced. The insulating layer was analyzed by an X-ray photoelectron spectroscopy, and it was found that the amount of aluminum atoms was 21.0 parts by weight relative to the total amount, i.e., 100 parts by weight, of carbon atoms and silicon atoms.

(3) Evaluation of Rectifying Element

For the purpose of evaluating the rectifying element produced above, a rectifier circuit was constructed in the same manner as in Example 2. When an alternating-current voltage (voltage amplitude: 10 [V]) was input to the input terminal 101, the average value of direct-current voltages that were output to the output terminal 103 was 4.5 [V] and the dispersion in the direct-current voltages was 0.3 [V].

Example 6

(1) Production of Semiconductor Solution

A compound [60] was synthesized by the method shown in formula 1.

Formula 1

[chemical formula 13]

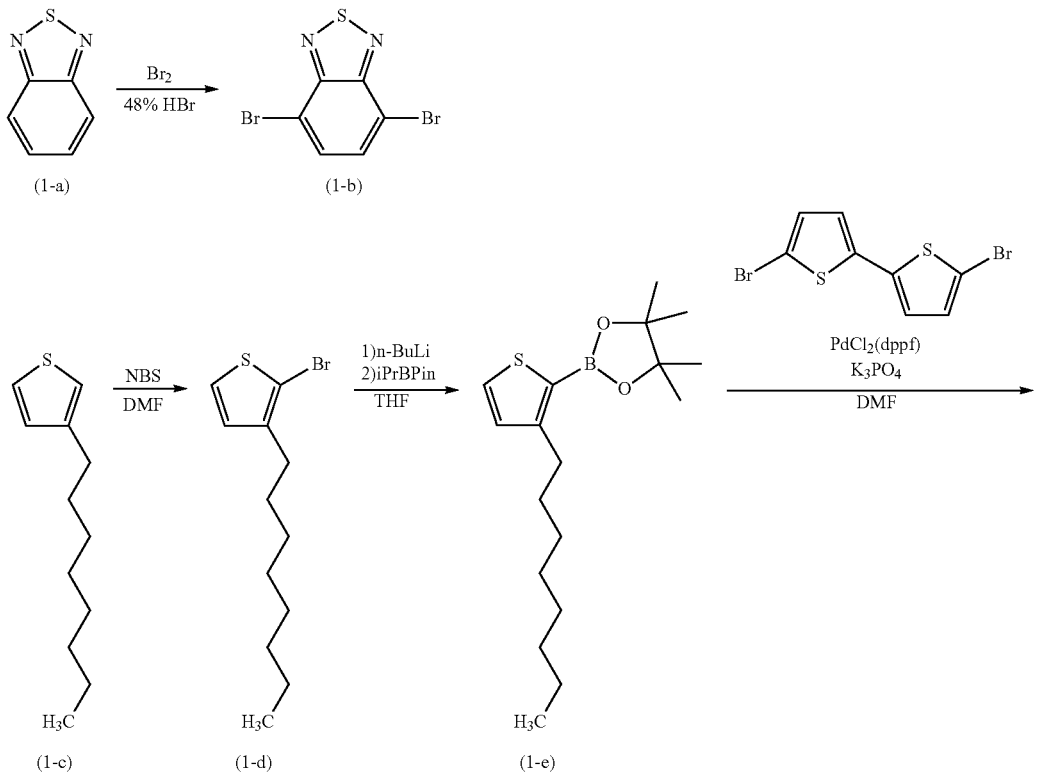

-continued
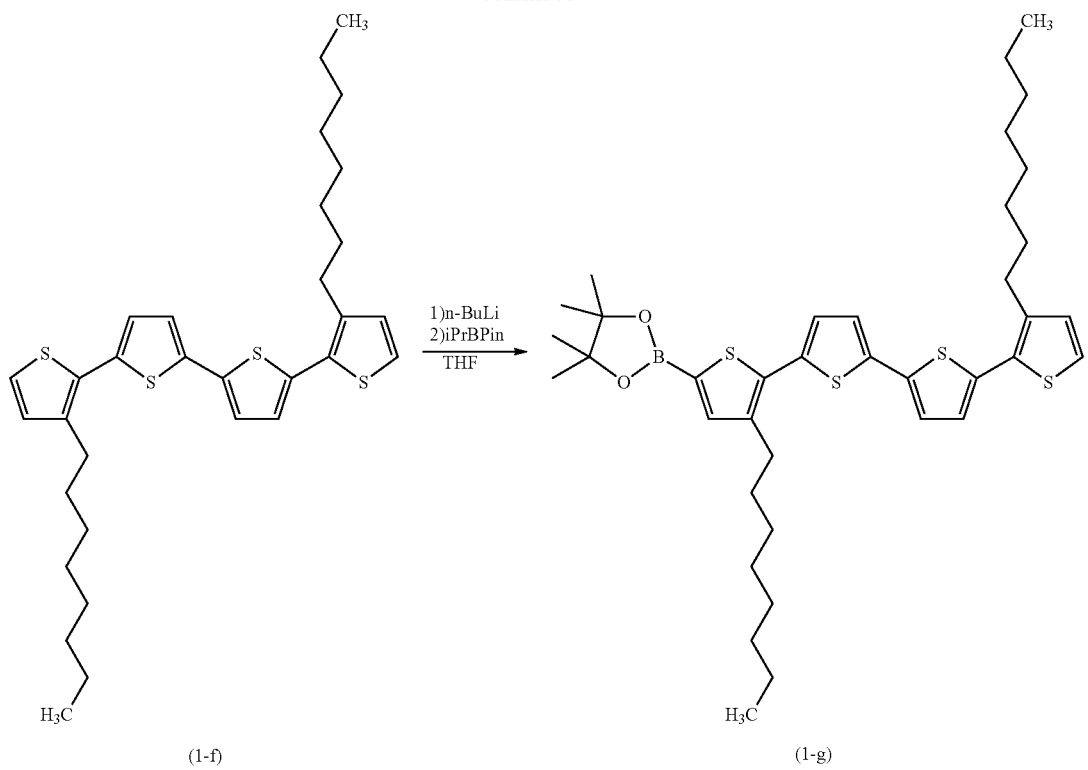
(1-f)     (1-g)
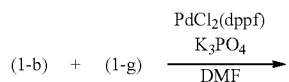
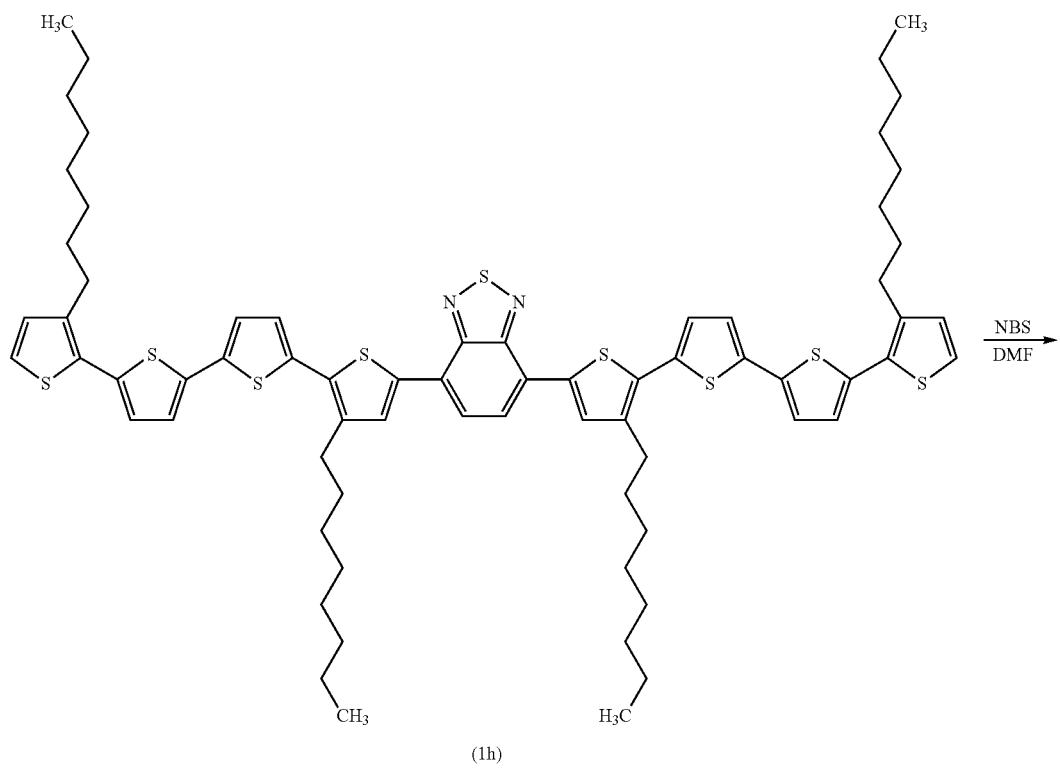
(1h)

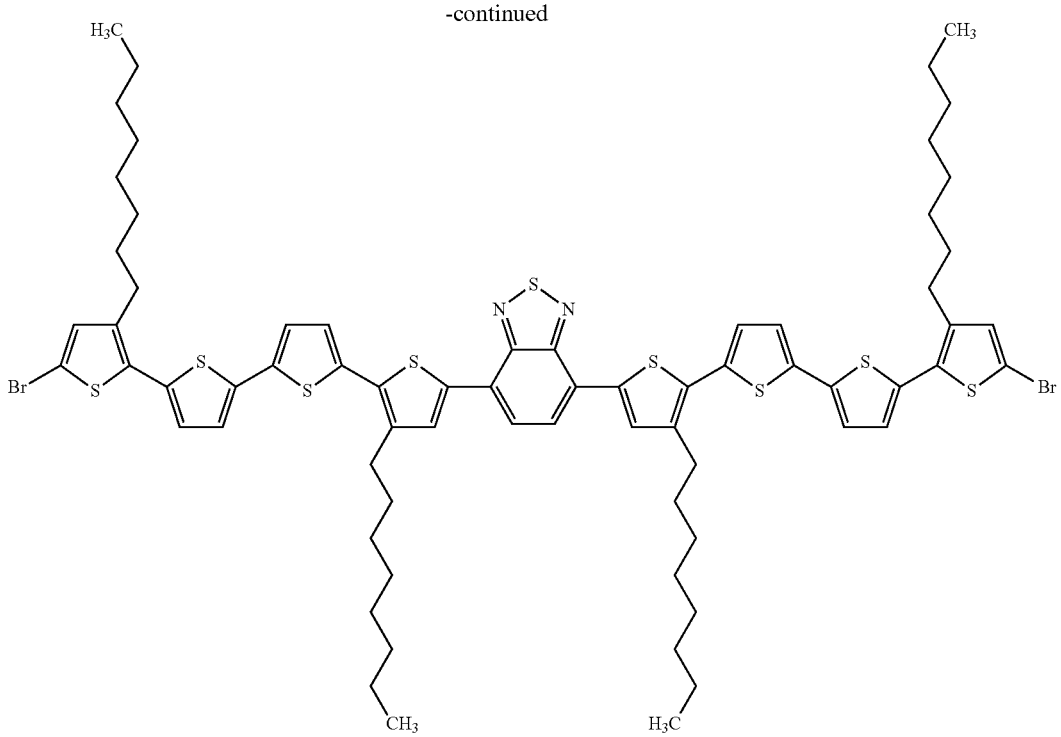

(1i)

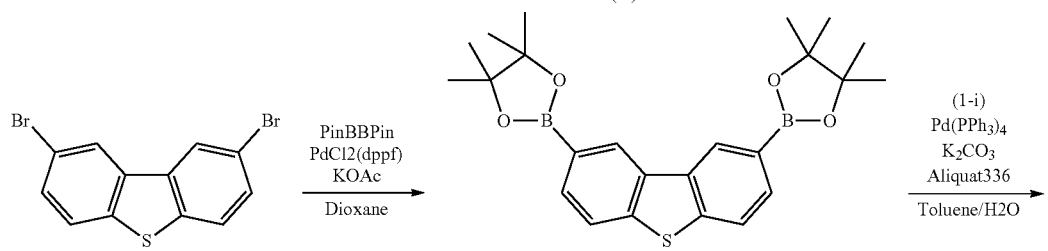

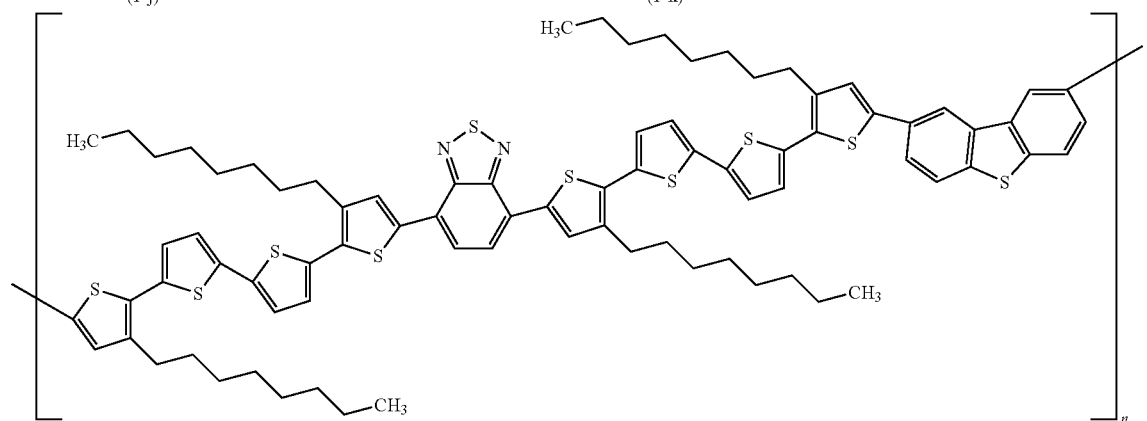

Compound (60)

A compound (1-a) (manufactured by Tokyo Chemical Industry Co., Ltd.) (4.3 g) and bromine (manufactured by Wako Pure Chemical Industries Ltd.) (10 g) were added to 48% hydrobromic acid (150 ml), and the resultant solution was stirred at 120° C. for 3 hours. The reaction solution was cooled to room temperature to precipitate a solid material, and the solid material was filtered through a glass filter and then washed with water (1000 ml) and acetone (100 ml). The resultant solid material was dried under vacuum at 60° C. to produce a compound (1-b) (6.72 g).

A compound (1-c) (10.2 g) was dissolved in dimethylformamide (100 ml), then N-bromosuccinimide (manufactured by Wako Pure Chemical Industries Ltd.) (9.24 g), was added thereto, and then the resultant solution was stirred at room temperature for 3 hours under a nitrogen atmosphere. Water (200 ml), n-hexane (200 ml) and dichloromethane (200 ml) were added to the resultant solution, and an organic layer was collected therefrom. The organic layer was washed with water (200 ml) and then dried over magnesium sulfate. The resultant solution was purified by column chromatography (filler: silica gel, eluting solution: hexane) to produce a compound (1-d) (14.4 g).

The compound (1-d) (14.2 g) was dissolved in tetrahydrofuran (200 ml), and the resultant solution was cooled to −80° C. n-Butyllithium (a 1.6-M solution in hexane) (manufactured by Wako Pure Chemical Industries Ltd.) (35 ml) was added to the solution, and the resultant solution was heated to −50° C. and then cooled to −80° C. again. 2-Isopropoxy-4,4,5,5-tetramethyl-1,3,2-dioxaborane (manufactured by Wako Pure Chemical Industries Ltd.) (13.6 ml) was added to the solution, and the resultant solution was heated to room temperature and then stirred under a nitrogen atmosphere for 4 hours. A 1-N aqueous ammonium chloride solution (200 ml) and ethyl acetate (200 ml) were added to the solution, and then an organic layer was collected therefrom. The organic layer was washed with water (200 ml) and then dried over magnesium sulfate. The resultant solution was purified by column chromatography (filler: silica gel, eluting solution: hexane/dichloromethane) to produce a compound (1-e) (14.83 g).

The compound (1-e) (14.83 g) and 5,5'-dibromo-2,2'-bithiophene (manufactured by Tokyo Chemical Industry Co., Ltd.) (6.78 g) were added to dimethylformamide (200 ml), then potassium phosphate (manufactured by Wako Pure Chemical Industries Ltd.) (26.6 g) and [bis(diphenylphosphino)ferrocene]dichloropalladium (manufactured by Aldrich) (1.7 g) were added to the solution under a nitrogen atmosphere, and the resultant solution was stirred at 100° C. for 4 hours. Water (500 ml) and ethyl acetate (300 ml) were added to the solution, and an organic layer was collected therefrom. The organic layer was washed with water (500 ml) and then dried over magnesium sulfate. The resultant solution was purified by column chromatography (filler: silica gel, eluting solution: hexane) to produce a compound (1-f) (4.53 g).

The compound (1-f) (4.53 g) was dissolved in tetrahydrofuran (40 ml), and the resultant solution was cooled to −80° C. n-Butyllithium (a 1.6-M solution in hexane) (6.1 ml) was added to the solution, and the resultant solution was heated to −5° C. and then cooled to −80° C. again. 2-Isopropoxy-4,4,5,5-tetramethyl-1,3,2-dioxaborane (2.3 ml) was added to the solution, and the resultant solution was heated to room temperature and then stirred under a nitrogen atmosphere for 2 hours. A 1-N aqueous ammonium chloride solution (150 ml) and ethyl acetate (200 ml) were added to the solution, and then an organic layer was collected therefrom. The organic layer was washed with water (200 ml) and then dried over magnesium sulfate. The resultant solution was purified by column chromatography (filler: silica gel, eluting solution: dichloromethane/hexane) to produce a compound (1-g) (2.31 g).

The compound (1-b) (0.498 g) and the compound (1-g) (2.31 g) were added to dimethylformamide (17 ml), then potassium phosphate (2.17 g) and [bis(diphenylphosphino)ferrocene]dichloropalladium (manufactured by Aldrich) (0.14 g) were added to the solution under a nitrogen atmosphere, and the resultant solution was stirred at 90° C. for 7 hours. Water (200 ml) and chloroform (100 ml) were added to the solution, and an organic layer was collected therefrom. The organic layer was washed with water (200 ml) and then dried over magnesium sulfate. The resultant solution was purified by column chromatography (filler: silica gel, eluting solution: dichloromethane/hexane) to produce a compound (1-h) (1.29 g). The results of the analysis of the compound (1-h) by $^1$H-NMR are as follows.

$^1$H-NMR (CD$_2$Cl$_2$, (d=ppm)): 8.00 (s, 2H), 7.84 (s, 2H), 7.20-7.15 (m, 8H), 7.04 (d, 2H), 6.95 (d, 2H), 2.88 (t, 4H), 2.79 (t, 4H), 1.77-1.29 (m, 48H), 0.88 (m, 12H).

The compound (1-h) (0.734 g) was dissolved in chloroform (15 ml), then N-bromosuccinimide (0.23 g)/dimethylformamide (10 ml) were added to the solution, and the resultant solution was stirred at room temperature for 9 hours under a nitrogen atmosphere. Water (100 ml) and chloroform (100 ml) were added to the resultant solution, and an organic layer was collected therefrom. The organic layer was washed with water (200 ml) and then dried over magnesium sulfate. The resultant solution was purified by column chromatography (filler:silica gel, eluting solution: dichloromethane/hexane) to produce a compound (1-i) (0.58 g).

The compound (1-j) (0.5 g), bis(pinacolato)diboron (manufactured by BASF) (0.85 g) and potassium acetate (manufactured by Wako Pure Chemical Industries Ltd.) (0.86 g) were added to 1,4-dioxane (7 ml), then [bis(diphenylphosphino)ferrocene]dichloropalladium (0.21 g) was added to the resultant solution under a nitrogen atmosphere, and the resultant solution was stirred at 80° C. for 7 hours. Water (100 ml) and ethyl acetate (100 ml) were added to the resultant solution, and an organic layer was collected therefrom. The organic layer was washed with water (100 ml) and then dried over magnesium sulfate. The resultant solution was purified by column chromatography (filler: silica gel, eluting solution: dichloromethane) to produce a compound (1-k) (57 mg).

The compound (1-i) (93 mg) and the compound (1-k) (19.3 mg) were dissolved in toluene (6 ml). Water (2 ml), potassium carbonate (0.18 g), tetrakis(triphenylphosphine) palladium (0) (manufactured by Tokyo Chemical Industry Co., Ltd.) (7.7 mg) and Aliquat (R) 336 (manufactured by Aldrich) (1 drop) were added to the resultant solution, and the solution was stirred at 100° C. for 25 hours under a nitrogen atmosphere. Subsequently, phenylboronic acid (40 mg) was added to the solution, and the resultant solution was stirred at 100° C. for 7 hours. Methanol (50 ml) was added to the resultant solution to produce a solid material, and the solid material was collected by filtration and then washed with methanol, water, methanol and acetone in this order. The resultant solid material was dissolved in chloroform, and the solution was allowed to pass through a silica gel short column (eluting solution: chloroform) and then concentrated to dryness to produce the compound [60] (30 mg). The compound [60] had a weight average molecular weight of 4367, a number average molecular weight of 3475 and a degree of polymerization n of 3.1.

The same procedure as in Example 1 was carried out, except that the compound [60] was used in place of P3HT. In this manner, a semiconductor solution B (the concentration of CNT composites in a solvent: 0.03 g/l) was produced.

(2) Production of Rectifying Element

The same procedure as in Example 5 was carried out, except that the semiconductor solution B was used in place of the semiconductor solution A. In this manner, a rectifying element was produced. The total length of the CNT composites which were present per 1 μm$^2$ of the semiconductor layer 4 was 30 μm.

(3) Evaluation of Rectifying Element

For the purpose of evaluating the rectifying element produced above, a rectifier circuit was constructed in the same manner as in Example 2. When an alternating-current voltage (voltage amplitude: 10 [V]) was input to the input terminal 101, the average value of direct-current voltages that were output to the output terminal 103 was 4.9 [V] and the dispersion in the direct-current voltages was 0.3 [V].

Example 7

(1) Production of Rectifying Element

A 5-mass % solution of polyvinylphenol (manufactured by Aldrich, weight average molecular weight (Mw): 20000, also referred to as "PVP", hereinafter) in butanol (10 μL) was drop-casted on a semiconductor layer 4 in a rectifying element that was produced in the same manner as in Example 6, thereby forming a second insulating layer. Subsequently, the resultant product was dried with air at 30° C. for 5 minutes and then heated at 120° C. for 30 minutes on a hot plate under a nitrogen stream to produce a rectifying element having the second insulating layer.

(2) Evaluation of Rectifying Element

For the purpose of evaluating the rectifying element produced above, a rectifier circuit was constructed in the same manner as in Example 2. When an alternating-current voltage (voltage amplitude: 10 [V]) was input to the input terminal 101, the average value of direct-current voltages that were output to the output terminal 103 was 3.8 [V] and the dispersion in the direct-current voltages was 0.4 [V]. The same measurement was carried out after 1 month, and similar measurement results were obtained.

Example 8

(1) Production of Rectifying Element

The same procedure as in Example 7 was carried out, except that a second insulating layer was formed in the same manner as in Example 7 using a 5-mass % solution of poly(methyl methacrylate) (manufactured by Aldrich, weight average molecular weight (Mw): 350000, also referred to as "PMMA", hereinafter) in methyl ethyl ketone. In this manner, a rectifying element was produced.

(2) Evaluation of Rectifying Element

For the purpose of evaluating the rectifying element produced above, a rectifier circuit was constructed in the same manner as in Example 2. When an alternating-current voltage (voltage amplitude: 10 [V]) was input to the input terminal 101, the average value of direct-current voltages that were output to the output terminal 103 was 5.0 [V] and the dispersion in the direct-current voltages was 0.3 [V]. The same measurement was carried out after 1 month, and similar measurement results were obtained.

Example 9

(1) Production of Rectifying Element

The same procedure as in Example 7 was carried out, except that a second insulating layer was formed in the same manner as in Example 7 using a 5-mass % solution of polystyrene (manufactured by Aldrich, weight average molecular weight (Mw): 192000, also referred to as "PS", hereinafter) in propylene glycol 1-monomethylether 2-acetate. In this manner, a rectifying element was produced.

(2) Evaluation of Rectifying Element

For the purpose of evaluating the rectifying element produced above, a rectifier circuit was constructed in the same manner as in Example 2. When an alternating-current voltage (voltage amplitude: 10 [V]) was input to the input terminal 101, the average value of direct-current voltages that were output to the output terminal 103 was 5.3 [V] and the dispersion in the direct-current voltages was 0.3 [V]. The same measurement was carried out after 1 month, and similar measurement results were obtained.

Example 10

(1) Production of Rectifying Element

The same procedure as in Example 7 was carried out, except that a second insulating layer was formed in the same manner as in Example 7 using the insulating layer solution B. In this manner, a rectifying element was produced.

(2) Evaluation of Rectifying Element

For the purpose of evaluating the rectifying element produced above, a rectifier circuit was constructed in the same manner as in Example 2. When an alternating-current voltage (voltage amplitude: 10 [V]) was input to the input terminal 101, the average value of direct-current voltages that were output to the output terminal 103 was 4.6 [V] and the dispersion in the direct-current voltages was 0.3 [V]. The same measurement was carried out after 1 month, and similar measurement results were obtained.

Example 11

(1) Production of Rectifying Element

The conductive paste A was applied onto a PET film having a thickness of 50 μm by screen printing, and was then prebaked in a drying oven at 100° C. for 10 minutes. Subsequently, the resultant product was exposed to light with an exposure machine "PEM-8M" (product name, manufactured by Union Optical Co., LTD.), was then developed by dipping in a 0.5% $Na_2CO_3$ solution for 30 seconds, was then rinsed with ultrapure water, and was then cured in a drying oven at 140° C. for 30 minutes to form an electrode 6. Subsequently, the insulating layer solution C was spin-coated (800 rpm×20 seconds) on the substrate on the PET film having the electrode 6 formed thereon and was then heated at 120° C. for 5 minutes, then the insulating layer solution C was spin-coated (800 rpm×20 seconds) thereon again, and then the resultant product was heated at 200° C. for 30 minutes under a nitrogen stream to form an insulating layer 5. The conductive paste A was applied onto the insulating layer 5 by spin coating, and the resultant product was prebaked in a drying oven at 100° C. for 10 minutes. Subsequently, the product was exposed to light with an exposure machine "PEM-8M", was then developed by dipping in a 0.5% $Na_2CO_3$ solution for 30 seconds, was then rinsed with ultrapure water, and was then cured in a drying oven at 140° C. for 30 minutes to form a first electrode 2 and a second electrode 3. Each of the pair of electrodes 2 and 3 had a width of 1000 μm, and the distance between the electrodes was 10 μm. A semiconductor layer 4 was formed on the substrate having the electrodes formed thereon in the same manner as in Example 2, and the resultant product was heated on a hot plate at 150° C. for 30 minutes under a nitrogen stream to produce a rectifying element which is the aspect illustrated in FIG. 3.

(2) Evaluation of Rectifying Element

For the purpose of evaluating the rectifying element produced above, a rectifier circuit was constructed in the same manner as in Example 2. When an alternating-current voltage (voltage amplitude: 10 [V]) was input to the input terminal 101, the average value of direct-current voltages that were output to the output terminal 103 was 4.5 [V] and the dispersion in the direct-current voltages was 0.3 [V]. The same measurement was carried out after 1 month, and similar measurement results were obtained.

In addition, the evaluation of the adhesion of the electrodes was also carried out, and delamination or cracking was not observed and the adhesion was good even after a bending action was repeated 100 times.

Comparative Example 1

(1) Production of Semiconductor Solution

The CNTs 1 (1.0 g) were added to chloroform (50 mL) and then dispersed for 1 hour with an ultrasonic washing machine. An aliquot (5 mL) of the dispersion was collected and then diluted into 100 mL, and the diluted solution was dispersed for 1 hour with an ultrasonic washing machine to produce a CNT dispersion C. The CNT dispersion C was filtered through a membrane filter (pore diameter: 10 μm, diameter: 25 mm, Omnipore membrane manufactured by Millipore) to remove CNTs each having a length of 10 μm or longer. In this manner, a semiconductor solution C was produced. However, the CNTs remained partially coagulated in the semiconductor solution C.

(2) Production of Rectifying Element

The same procedure as in Example 1 was carried out, except that the semiconductor solution C was used in place of the semiconductor solution A. In this manner, a rectifying element was produced.

(3) Evaluation of Rectifying Element

For the purpose of evaluating the rectifying element produced above, current-voltage properties were measured in the same manner as in Example 1. As a result, it was confirmed that rectifying properties were achieved. However, the value of a current that flowed into the rectifying element upon the application of a voltage of 2 V was 1 pA.

Comparative Example 2

(1) Production of Rectifying Element

The semiconductor solution C was produced in the same manner as in Comparative Example 1. The same procedure as in Example 5 was carried out, except that the semiconductor solution C was used in place of the semiconductor solution A. In this manner, a rectifying element was produced.

(2) Evaluation of Rectifying Element

For the purpose of evaluating the rectifying element produced above, a rectifying circuit was constructed in the same manner as in Example 2. When an alternating-current voltage (voltage amplitude: 10 [V]) was input, no direct-current voltage was output.

Comparative Example 3

(1) Production of Semiconductor Solution

The CNTs 1 (1.5 mg) and sodium dodecylsulfate (manufactured by Wako Pure Chemical Industries Ltd.) (1.5 mg) were added to water (30 ml), and the solution was stirred ultrasonically using an ultrasonic homogenizer at an output of 250 W for 3 hours while ice-cooling to produce a CNT composite dispersion D (the concentration of CNT composites in a solvent: 0.05 g/l). The CNT composite dispersion D was centrifuged at 21000 G for 30 minutes using a centrifugal machine (CT15E, manufactured by Hitachi Koki Co., Ltd.), and then 80 vol % of a supernatant was collected. In this manner, a semiconductor solution D was produced.

(2) Production of Rectifying Element

The same procedure as in Example 5 was carried out, except that the semiconductor solution D was used in place of the semiconductor solution A. In this manner, a rectifying element was produced.

(3) Evaluation of Rectifying Element

For the purpose of evaluating the rectifying element produced above, a rectifier circuit was constructed in the same manner as in Example 2. When an alternating-current voltage (voltage amplitude: 10 [V]) was input, the average value of direct-current voltages that were output to the output terminal 103 was 2.0 [V] and the dispersion in the direct-current voltages was 2.0 [V], and therefore steady direct-current voltages could not be obtained.

TABLE 1

| | Constitution of rectifying element | Semiconductor layer | Insulating layer | Second insulating layer | Electrode | Total length of CNT composite in 1 μm$^2$ | Current value (upon application of 2 V) | Results of evaluation in rectifying circuit |
|---|---|---|---|---|---|---|---|---|
| Example 1 | FIG. 1 | Semiconductor solution A | — | — | Au/Al | — | 10 uA | — |
| Example 2 | FIG. 3 | Semiconductor solution A | Insulating layer solution B | — | Au | 20 | — | Output voltage 2.5 V (dispersion 0.8 V) |
| Example 3 | FIG. 3 | Semiconductor solution A | Insulating layer solution B | — | Au | 5 | — | Output voltage 1.8 V (dispersion 0.9 V) |
| Example 4 | FIG. 3 | Semiconductor solution A | Insulating layer solution B | — | Au | 100 | — | Output voltage 1.5 V (dispersion 0.3 V) |
| Example 5 | FIG. 3 | Semiconductor solution A | Insulating layer solution C | — | Au | — | — | Output voltage 4.5 V (dispersion 0.3 V) |
| Example 6 | FIG. 3 | Semiconductor solution B | Insulating layer solution C | — | Au | 30 | — | Output voltage 4.9 V (dispersion 0.3 V) |
| Example 7 | FIG. 3 | Semiconductor solution B | Insulating layer solution C | PVP | Au | 30 | — | Output voltage 3.8 V (dispersion 0.4 V) |
| Example 8 | FIG. 3 | Semiconductor solution B | Insulating layer solution C | PMMA | Au | 30 | — | Output voltage 5.0 V (dispersion 0.3 V) |
| Example 9 | FIG. 3 | Semiconductor solution B | Insulating layer solution C | PS | Au | 30 | — | Output voltage 5.3 V (dispersion 0.3 V) |
| Example 10 | FIG. 3 | Semiconductor solution B | Insulating layer solution C | Insulating layer solution B | Au | 30 | — | Output voltage 4.6 V (dispersion 0.3 V) |
| Example 11 | FIG. 3 | Semiconductor solution B | Insulating layer solution C | — | Conductive paste A | 30 | — | Output voltage 4.5 V (dispersion 0.3 V) |

TABLE 1-continued

| | Constitution of rectifying element | Semiconductor layer | Insulating layer | Second insulating layer | Electrode | Total length of CNT composite in 1 μm² | Current value (upon application of 2 V) | Results of evaluation in rectifying circuit |
|---|---|---|---|---|---|---|---|---|
| Comparative Example 1 | FIG. 1 | Semiconductor solution C | — | — | Au/Al | — | 1 pA | — |
| Comparative Example 2 | FIG. 3 | Semiconductor solution C | Insulating layer solution C | — | Au | — | — | Direct-current output was not obtained |
| Comparative Example 3 | FIG. 3 | Semiconductor solution D | Insulating layer solution C | — | Au | — | — | Output voltage 2.0 V (dispersion 2.0 V) |

DESCRIPTION OF REFERENCE SIGNS

1: Base
2: First electrode
3: Second electrode
4: Semiconductor layer
5: Insulating layer
6: Third electrode
7: Wiring line
100: Rectifying element
101: Input terminal
102: Capacitor
103: Output terminal
50: Antenna
500: Rectifier circuit (power source generation unit)
501: Demodulator circuit
502: Modulator circuit
503: Controller circuit
504: Memory circuit

The invention claimed is:

1. A rectifying element comprising an insulating base, (a) a pair of electrodes composed of a first electrode and a second electrode and (b) a semiconductor layer arranged between the pair of electrodes, the components (a) and (b) being provided on a first surface of the insulating base, wherein the semiconductor layer (b) contains carbon nanotube composites each of which comprises a carbon nanotube and a conjugated polymer adhered onto at least a part of the surface of the carbon nanotube, and wherein a total length of the CNT composites which are present per 1 μm² of the semiconductor layer is 10 to 50 μm.

2. The rectifying element according to claim 1, further comprising (c) an insulating layer and (d) a third electrode, the components (a) to (d) being provided on a first surface of the insulating base, wherein any one of the pair of electrodes (a) is electrically connected to the third electrode (d) and the third electrode (d) is electrically insulated from the semiconductor layer (b) by the insulating layer (c).

3. The rectifying element according to claim 1, wherein the distance between the pair of electrodes (a) is 1 to 100 μm inclusive.

4. The rectifying element according to claim 1, wherein the conjugated polymer contains a condensed heteroaryl unit having a nitrogenated double bond in the ring thereof and a thiophene unit in repeating units.

5. The rectifying element according to claim 1, wherein the conjugated polymer has a structure represented by general formula (1):

[chemical formula 1]

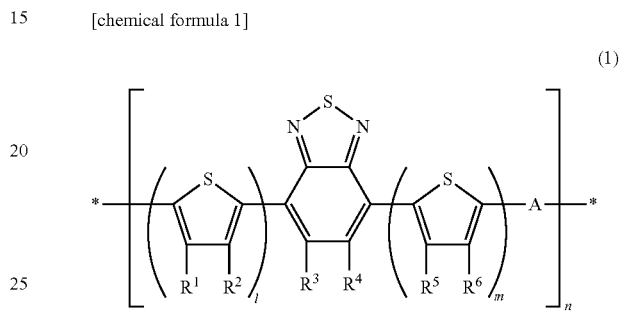

wherein $R^1$ to $R^6$ are the same as or different from one another and respectively represent a hydrogen atom, an alkyl group, a cycloalkyl group, a heterocyclic group, an alkenyl group, a cycloalkenyl group, an alkynyl group, an alkoxy group, an alkylthio group, an aryl ether group, an aryl thioether group, an aryl group, a heteroaryl group, a halogen atom, a cyano group, a formyl group, a carbamoyl group, an amino group, an alkylcarbonyl group, an arylcarbonyl group, a carboxyl group, an alkoxycarbonyl group, an aryloxycarbonyl group, an alkylcarbonyloxy group, an arylcarbonyloxy group or a silyl group; any adjacent two of $R^1$ to $R^6$ may together form a ring structure; A is selected from a single bond, an arylene group, a heteroarylene group other than a thienylene group, an ethenylene group and an ethynylene group; l and m respectively represent an integer of 0 to 10, provided that l+m≥1; n represents a numerical value of 2 to 1000; and, when each of l, m and n is 2 or greater, each of $R^1$'s to $R^6$'s and A's may be the same as or different from each other.

6. The rectifying element according to claim 2, wherein the insulating layer contains an organic compound containing a bond between silicon and carbon and a metal compound containing a bond between a metal atom and an oxygen atom, and the metal atom is contained in the insulating layer in an amount of 10 to 180 parts by mass relative to a total amount, of 100 parts by mass, of the carbon atom and the silicon atom.

7. The rectifying element according to claim 2, further comprising a second insulating layer formed on a side of the semiconductor layer which is opposed to the insulating layer (c).

8. The rectifying element according to claim 7, wherein the second insulating layer contains an organic high-molecular-weight material selected from the group consisting of polysiloxane, polystyrene, polyvinylphenol and poly(methyl methacrylate).

9. The rectifying element according to claim 1, wherein at least one of the electrodes contains a conductive material and a binder.

10. A rectifying element comprising an insulating base, (a) a pair of electrodes composed of a first electrode and a second electrode and (b) a semiconductor layer arranged between the pair of electrodes, the components (a) and (b) are provided on a first surface of the insulating base, wherein the semiconductor layer (b) contains carbon nanotubes and a total length of the carbon nanotubes which are present per 1 $\mu m^2$ of the semiconductor layer (b) is 10 to 50 $\mu m$.

11. The rectifying element according to claim 10, further comprising (c) an insulating layer and (d) a third electrode, the components (a) to (d) being provided on a first surface of the insulating base, wherein any one of the pair of electrodes (a) is electrically connected to the third electrode (d) and the third electrode (d) is electrically insulated from the semiconductor layer (b) by the insulating layer (c).

12. A method for producing a rectifying element as recited in claim 1, comprising the step of applying a composition containing carbon nanotube composites onto a base to form a semiconductor layer, wherein each of the carbon nanotube composites comprises a carbon nanotube and a conjugated polymer adhered onto at least a part of the surface of the carbon nanotube.

13. A rectifier circuit comprising at least a rectifying element as recited in claim 1 and a capacitor.

14. A wireless communication device comprising at least a rectifier circuit as recited in claim 13 and an antenna.

15. A commodity tag utilizing a wireless communication device as recited in claim 14.

* * * * *

UNITED STATES PATENT AND TRADEMARK OFFICE
CERTIFICATE OF CORRECTION

PATENT NO. : 10,490,748 B2  
APPLICATION NO. : 15/711560  
DATED : November 26, 2019  
INVENTOR(S) : Hiroji Shimizu et al.

Page 1 of 1

It is certified that error appears in the above-identified patent and that said Letters Patent is hereby corrected as shown below:

On the Title Page

Item [72], Inventors:
"Hiroji Shimizu, Otsu (JP)" should read --Hiroji Shimizu, Otsu-shi, Shiga (JP)--
"Seiichiro Murase, Otsu (JP)" should read --Seiichiro Murase, Otsu-shi, Shiga (JP)--

Signed and Sealed this
Fourteenth Day of January, 2020

Andrei Iancu
*Director of the United States Patent and Trademark Office*